(12) United States Patent
Bibby, Jr. et al.

(10) Patent No.: US 10,845,711 B2
(45) Date of Patent: *Nov. 24, 2020

(54) LITHOGRAPHY OPTICS ADJUSTMENT AND MONITORING

(71) Applicant: Cymer, LLC, San Diego, CA (US)

(72) Inventors: Thomas Frederick Allen Bibby, Jr., San Diego, CA (US); Omar Zurita, San Diego, CA (US); Abhishek Subramanian, San Diego, CA (US); Thomas Patrick Duffey, San Diego, CA (US)

(73) Assignee: Cymer, LLC, San Diego, CA (US)

( * ) Notice: Subject to any disclaimer, the term of this patent is extended or adjusted under 35 U.S.C. 154(b) by 0 days.

This patent is subject to a terminal disclaimer.

(21) Appl. No.: 16/439,893

(22) Filed: Jun. 13, 2019

(65) Prior Publication Data

US 2019/0310558 A1 Oct. 10, 2019

Related U.S. Application Data

(60) Division of application No. 15/619,900, filed on Jun. 12, 2017, now Pat. No. 10,345,714, which is a continuation-in-part of application No. 15/208,152, filed on Jul. 12, 2016, now Pat. No. 10,095,118.

(51) Int. Cl.
*G03F 7/20* (2006.01)
*G01J 1/42* (2006.01)

(52) U.S. Cl.
CPC .......... *G03F 7/70516* (2013.01); *G01J 1/429* (2013.01); *G01J 1/4257* (2013.01); *G03F 7/2004* (2013.01); *G03F 7/7015* (2013.01); *G03F 7/70591* (2013.01); *G01J 2001/4247* (2013.01)

(58) Field of Classification Search
CPC .......... G03F 7/70516; G03F 7/70591
See application file for complete search history.

(56) References Cited

U.S. PATENT DOCUMENTS

| 4,916,319 A | 4/1990 | Telfair et al. |
| 5,179,419 A | 1/1993 | Palmquist |
| 5,783,340 A | 7/1998 | Farino |
| 6,114,704 A | 9/2000 | Buck |

(Continued)

FOREIGN PATENT DOCUMENTS

| CN | 102637994 A | 8/2012 |
| CN | 103676416 A | 3/2014 |

(Continued)

OTHER PUBLICATIONS

Search Report issued in SG Patent Application No. 11201810276Y dated Sep. 27, 2019 (3 pages).

(Continued)

*Primary Examiner* — Steven Whitesell Gordon
(74) *Attorney, Agent, or Firm* — DiBerardino McGovern IP Group LLC

(57) ABSTRACT

Methods and apparatus for processing an image of a beam generated by an optical system to extract information indicative of an extent of damage to optical elements in the optical system. Also disclosed is a beam image and analysis tool capable of acquiring an image of a beam at any one of a number of locations.

20 Claims, 26 Drawing Sheets

(56) References Cited

U.S. PATENT DOCUMENTS

| | | | |
|---|---|---|---|
| 6,192,064 B1 * | 2/2001 | Algots | G02B 5/1828 |
| | | | 372/100 |
| 6,690,704 B2 | 2/2004 | Fallon | |
| 6,700,916 B1 | 3/2004 | Kramer et al. | |
| 7,923,705 B2 * | 4/2011 | Moriya | G03F 7/70033 |
| | | | 250/423 R |
| 7,955,766 B2 | 6/2011 | Kymissis | |
| 10,345,714 B2 * | 7/2019 | Bibby, Jr. | G01J 1/4257 |
| 2001/0009560 A1 | 7/2001 | Heist et al. | |
| 2002/0159064 A1 | 10/2002 | Wakabayashi et al. | |
| 2003/0151002 A1 | 8/2003 | Ito et al. | |
| 2005/0179881 A1 * | 8/2005 | Kohno | G03F 7/70108 |
| | | | 355/53 |
| 2009/0080476 A1 | 3/2009 | Partlo | |
| 2010/0005911 A1 | 1/2010 | Scott | |
| 2010/0140512 A1 | 6/2010 | Suganuma et al. | |
| 2010/0248099 A1 | 9/2010 | Kymissis | |
| 2012/0117521 A1 | 5/2012 | Feng et al. | |
| 2013/0009076 A1 * | 1/2013 | Yamatani | G03F 7/2004 |
| | | | 250/504 R |
| 2013/0179847 A1 | 7/2013 | Hansen | |
| 2016/0076944 A1 | 3/2016 | Moriya et al. | |

FOREIGN PATENT DOCUMENTS

| | | |
|---|---|---|
| JP | H04188745 A | 7/1992 |
| JP | 2000088705 A | 3/2000 |
| JP | 2001177165 A | 6/2001 |
| JP | 2003249435 A | 9/2003 |
| JP | 2008103151 A | 5/2008 |
| JP | 2012156527 A | 8/2012 |
| WO | 2006080513 A1 | 8/2006 |
| WO | 2011064969 A1 | 6/2011 |
| WO | 2015029141 A1 | 3/2015 |
| WO | 2015099132 A1 | 7/2015 |

OTHER PUBLICATIONS

Office Action issued in CN Application No. 2018-560521, dated Dec. 23, 2019, 13 pages (with English Translation).

* cited by examiner

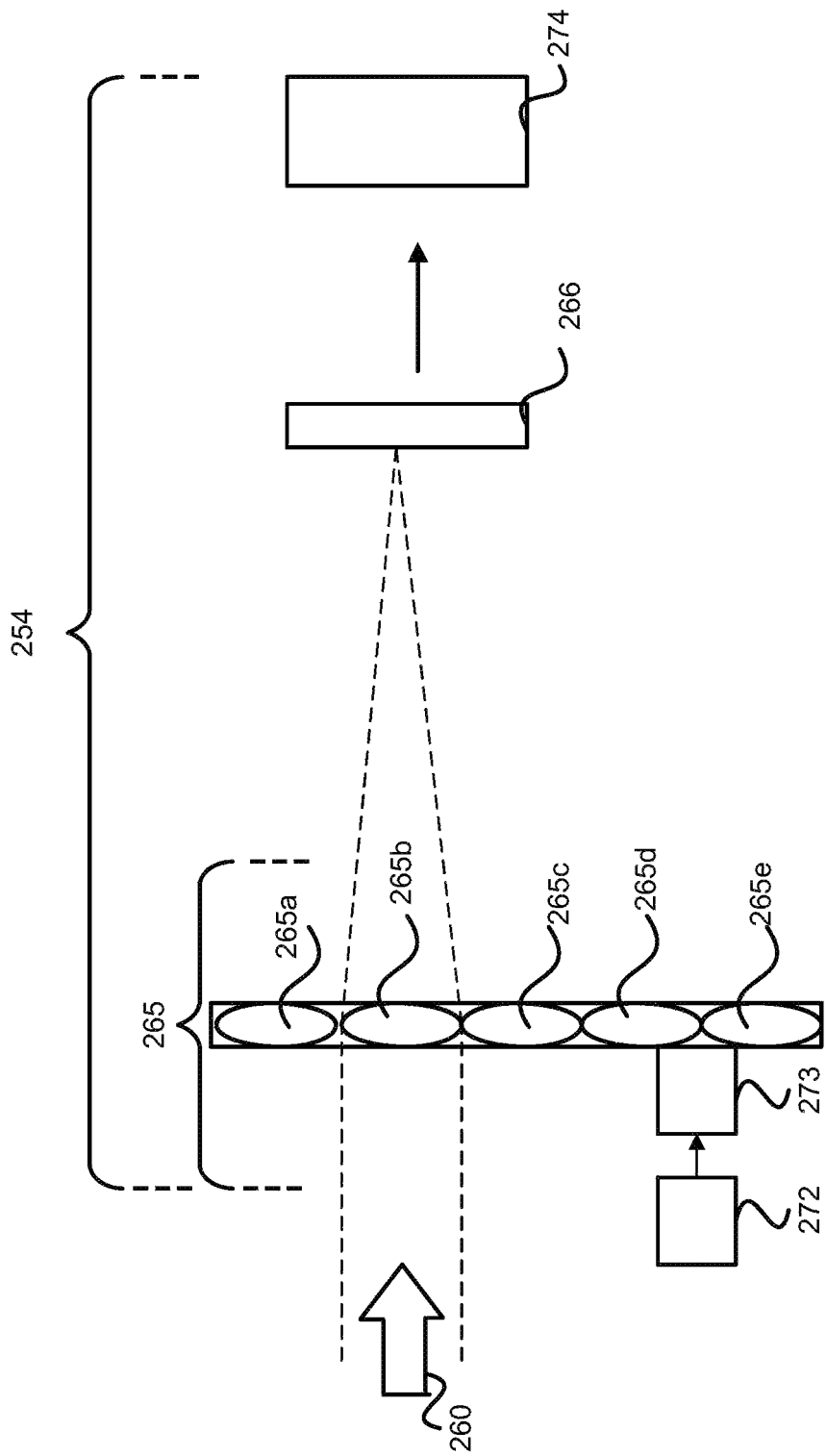

LITHOGRAPHY OPTICS ADJUSTMENT AND MONITORING

CROSS-REFERENCE TO RELATED APPLICATION

This application is a continuation-in-part of application Ser. No. 15/208,152 filed Jul. 12, 2016, the specification of which is hereby incorporated by reference in its entirety.

FIELD

The present disclosed subject matter relates to optics in laser-generated light sources such as are used for integrated circuit photolithographic manufacturing processes.

BACKGROUND

The optical elements used in light sources for semiconductor photolithography deteriorate over time, which in turn leads to a decline in light source performance that cannot be remedied while the system is in production. For example, calcium fluoride ($CaF_2$) is a crystalline material commonly used in deep ultra-violet (DUV) light sources for various applications such as, e.g., windows, beamsplitters, and reflectors. While $CaF_2$ is a robust material for extended use in lithography systems, degradation of $CaF_2$ may occur via any one of several mechanisms. Aside from catastrophic fracture, these mechanisms tend to degrade performance of the $CaF_2$ optic slowly. Initially, such degradation may be relatively inconsequential, but eventually the optical performance of the affected component deteriorates sufficiently that the light source must be taken off line to replace the optic or the module containing the optic.

One particular optical degradation mechanism involves the formation of slip planes. Slip planes occur when thermomechanical stresses induce subtle fractures in the $CaF_2$ crystal lattice. Visually, slip planes appear as lines on the optic that are disposed at well-defined angles relative to the orientation of the crystal lattice. Visual inspection is practical only after the damaged optic has been removed from the light source, which can occur only when the light source has been removed from production.

Another optical degradation mechanism is the formation of line damage, one form of which results from the superposition of multiple portions of a beam on an optic that has a coating. The combined energy of these multiple portions may exceed a damage threshold for the coating on the optic. When this occurs it damages the coating in the area of superposition, which creates a distinct line that can diffract light. The line damage is a problem because it can cause distortions in the beam profile that reduce module lifetime. It would be advantageous to be able to detect the existence and extent of line damage.

Yet another aspect of an optical degradation mechanism is the presence of point-like defects due to particles on an optic at some location within the system. Such particles typically do not have an undue adverse effect on optical performance because they are so few in number, but they can affect image processing. It would be advantageous to be able to identify the presence, location, and nominal size of point-like defects.

Yet another aspect optical degradation mechanism is the presence of worm-like features in the beam image associated with coating damage on OPuS beamsplitters, which degrades optical performance. It would be advantageous to be able to identify the presence, location, and nominal size of worm-like features.

An additional damage mechanism that degrades optical performance is the onset and growth of dendritic formations. These dendrites resemble a white fuzz, and they are commonly referred to as such. The presence of dendrites indicates a coating failure, which leads to localized heating of the optic in the vicinity of the dendrites. The heating exacerbates coating failure, so the affected region of the optic expands, which further exacerbates the localized heating and causes thermal lensing. The optical performance of the laser then degrades, and eventually the affected optics must be replaced. It would be advantageous to be able to detect the onset and progression of dendrite formation.

A common aspect of the challenges associated with these damage mechanisms is a need for a way to detect and identify low-level signals associated with these defects, and for attributing these signals to specific defect types. A further need exists for ways of monitoring the evolution of these defects that allows prediction of how much time remains before light source optical performance decreases sufficiently that an optic or module must be replaced.

One method of detecting changes in the optical components involves imaging a portion of the laser beam that has passed through the components. This method typically involves acquiring both a near field and far field image of the beam at the exit aperture of the system. While such a method is effective for detecting optical damage it is in general not capable of pinpointing where in the optical path the damage has occurred. It would be advantageous to have a system in which images of the beam can be acquired at locations in addition to the exit aperture.

Eventually, the light source must be taken out of production use so degraded modules and optics can be replaced. This obviously leads to downtime for the scanner. It is desirable that downtime be minimized to the fullest extent possible. While planning maintenance events can reduce the adverse impact of lost production time, all downtime comes at a significant cost to chip makers. The total amount of time the light source is out of production is sometimes referred to as the "green-to-green" time.

During maintenance, once any required replacement modules and optics have been installed, the light source must be re-aligned. As mentioned, the light sources can be embodied as a set of modules. In such cases, alignment typically involves adjusting positioners that tip and/or tilt individual optical elements within the modules in some cases, and entire modules in other cases. Once aligned, the light source can be used for significant amount of time without additional adjustment. The amount of time required to realign the optics and modules adds disadvantageously to the green-to-green time. Alignment may be carried out by the use of mechanical alignment actuators but this can be unduly time consuming.

One part of the alignment process may be carried out to compensate for chamber resonances. Laser radiation for semiconductor photolithography is typically supplied as a series of pulses at a specified repetition rate. Chamber resonances may occur at some repetition rates and cause sharp increases in performance metrics, (e.g. pointing and divergence) near the resonant frequencies, with low valleys or floors at frequencies adjacent to the resonance. The presence of resonances per se may be acceptable provided all the data points remain within specification, although additional time and effort may be required during alignment to keep the performance metrics within specification. In addition, a resonance caused peak-to-valley differences in performance metrics may create technical challenges for scanner design and control.

Measures to minimize the total amount of green-to-green time include both reducing the number of maintenance events and reducing the length of the maintenance events when they do occur. The number of maintenance events can be reduced by extending the operational life of the modules and optics and by having a reliable way of determining the amount of optic damage in situ. The length of the maintenance events can be reduced by reducing the amount of time needed to align replacement modules and optics.

SUMMARY

The following presents a simplified summary of one or more embodiments in order to provide a basic understanding of the present invention. This summary is not an extensive overview of all contemplated embodiments, and is not intended to identify key or critical elements of all embodiments nor delineate the scope of any or all embodiments. Its sole purpose is to present some concepts of one or more embodiments in a simplified form as a prelude to the more detailed description that is presented later.

According to one aspect, the subject matter of the present disclosure addresses the problem that current downtimes are too long by providing a way to reduce downtime. The subject matter of the present disclosure also addresses the problem of extending the life of modules and optics. The subject matter of the present disclosure also addresses improving scanner performance at repetition rates at or near a chamber resonance.

The subject matter of the present disclosure addresses these problems at least in part by using electrically operated and controlled alignment actuators to adjust the optical elements and modules instead of purely mechanical alignment actuators. The subject matter of the present disclosure also addresses these problems at least in part through provision of optical sensors, e.g., cameras, for imaging fluorescent alignment screens that indicate a state of alignment. The subject matter of the present disclosure addresses these problems at least in part by using data from a beam imager such as a combined autoshutter metrology module ("CASMM") to guide alignment. This alignment could be carried out in any one of several operational modes. For example, as described in more detail below, alignment could be carried out in a manual mode, a semi-automatic mode, a full automatic mode, a light source directed mode, or a scanner directed mode.

According to another aspect, the provision of electrically adjustable actuators with an on-board controller creates the ability to perform light source alignment dynamically, with adjustments and validation taking place during pauses in production use. It also creates the ability to perform ongoing performance metric flattening (i.e., reducing differences between maximum and minimum values). For example, when the scanner directs operation at a particular repetition rate change that falls near a chamber resonance frequency, the light source may adjust one or more optics to compensate for the resonance by reducing the resonance peak.

According to another aspect, the subject matter of the present disclosure addresses the problem of detecting the presence of one or more slip planes from near field images, where the detection may be automatic, and where the evolution of the slip planes as a function of time may be sensed and quantified. Here and elsewhere, "time" can refer to chronological time measured, for example, in terms of days, weeks, or months, etc., or operational time measured, for example, by the accumulated running time of the system, number of pulses, etc., or some hybrid time determined as a function of both chronological and operational time.

According to another aspect, the subject matter of the present disclosure addresses determining whether the laser beam is clipping an aperture within the light source by detecting diffraction caused when the at least partially coherent laser beam diffracts upon striking an obstruction such as the edge of an aperture.

According to another aspect, the subject matter of the present disclosure addresses sensing the presence of line damage.

More generally, according to another aspect, the subject matter of the present disclosure addresses detecting the presence of lines embedded in a noisy background signal.

According to another aspect, the subject matter of the present disclosure addresses sensing the presence of point-like defects such as particles on an optic.

According to another aspect, the subject matter of the present disclosure addresses sensing the presence of worm-like features in a beam image.

According to another aspect, the subject matter of the present disclosure addresses detecting some types of optical misalignment from the presence of fringes parallel to and immediately adjacent to the edge of a near field image.

According to another aspect, the subject matter of the present disclosure addresses the need for obtaining images along the beam path in addition to near field and far field images.

According to one aspect, there is disclosed a method for automatically detecting a state of a light source for semiconductor photolithography, the method comprising the steps of obtaining an image of a light beam produced by the light source, extracting a portion from the image, obtaining image data from the portion, filtering the image data using a matching filter, storing the results of the filtering operation in a database, wherein the above steps are performed repeatedly over a period of time to detect the state repeatedly. The method also includes comparing the plurality of stored results of the filtering operation to determine an evolution of the state over time and performing maintenance on the light source after a period of time having a duration based at least in part on the evolution of the state over time. The state may be the existence of worm-like features in the image. The state may be an extent of existence of slip plane defects in at least one optical element in the light source.

According to another aspect, there is disclosed a method for automatically detecting a state of a light source for semiconductor photolithography, the method comprising the steps of obtaining an image of a light beam produced by the light source, extracting a portion from the image, obtaining image data from the portion, filtering the image data using a matching filter, appending the results of the filtering operation to a database containing a plurality of previous results of performing the above steps, comparing the plurality of results stored in the database to determine an evolution of the state over time, and performing maintenance on the light source after a period of time having a duration based at least in part on the evolution of the state over time.

The state may be the existence of worm-like features in the image. The state may be an existence of slip plane defects in at least one optical element in the light source. The state may be an extent of existence of slip plane defects in at least one optical element in the light source.

The step of appending the results of the filtering operation to a database containing a plurality of previous results may be performed using wraparound indexing. The step of appending the results of the filtering operation to a database containing a plurality of previous results may be performed using bit shifting. The method may comprise an additional step of generating a video image from the results stored in the database.

According to another aspect there is disclosed a photolithographic apparatus comprising a laser source for generating a laser beam and an imager for imaging the laser beam after it has traversed an optical path of the light source, the optical path including a plurality of optical components, the imager comprising a screen element arranged to receive at least a portion of the laser beam and generating an image of the laser beam when struck by at least a portion of the laser beam, a camera arranged to view the screen element for acquiring the image of the laser beam on the screen element, and an optical module arranged between the plurality of optical components and the screen element, the optical module including at least one movable optical element for altering the image on the screen.

The optical module may comprise a variable focus lens. The optical module may comprise a parfocal lens. The apparatus may additionally include a driver with the at least one movable optical element being mechanically coupled to the driver. The driver may comprise a stepper motor. The driver may comprise a piezoelectric translator. The at least one movable optical element may be mechanically coupled to a driver mounted on a track. The apparatus may further comprise a controller electrically connected to the driver wherein the controller generates a control signal to control the driver.

BRIEF DESCRIPTION OF THE DRAWING

FIG. 3C shows a schematic, not to scale, view of an overall broad conception of another example of a beam imager adapted to obtain images at multiple points along a beam path.

DETAILED DESCRIPTION

Figure 1:
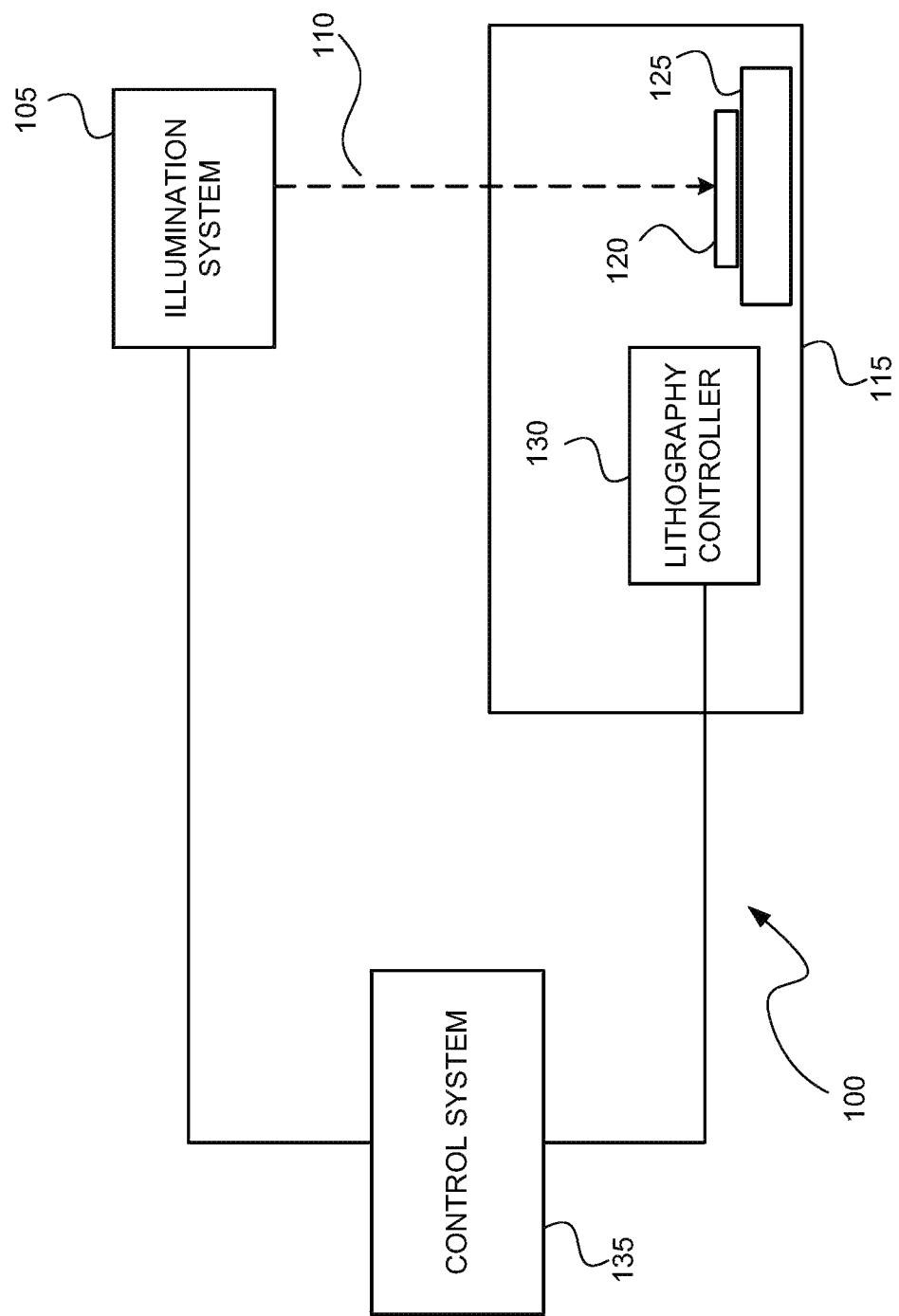
FIG. 1 shows a schematic, not to scale, view of an overall broad conception of a photolithography system according to an aspect of the disclosed subject matter.

Various embodiments are now described with reference to the drawings, wherein like reference numerals are used to refer to like elements throughout. In the following description, for purposes of explanation, numerous specific details are set forth in order to promote a thorough understanding of one or more embodiments. It may be evident in some or all instances, however, that any embodiment described below can be practiced without adopting the specific design details described below. In other instances, well-known structures and devices are shown in block diagram form in order to facilitate description of one or more embodiments. The following presents a simplified summary of one or more embodiments in order to provide a basic understanding of the embodiments. This summary is not an extensive overview of all contemplated embodiments, and is not intended to identify key or critical elements of all embodiments nor delineate the scope of any or all embodiments.

Referring to FIG. 1, a photolithography system 100 that includes an illumination system 105. As described more fully below, the illumination system 105 includes a light source that produces a pulsed light beam 110 and directs it to a photolithography exposure apparatus or scanner 115 that patterns microelectronic features on a wafer 120. The wafer 120 is placed on a wafer table 125 constructed to hold wafer 120 and connected to a positioner configured to accurately position the wafer 120 in accordance with certain parameters.

The photolithography system 100 uses a light beam 110 having a wavelength in the deep ultraviolet (DUV) range, for example, with wavelengths of 248 nanometers (nm) or 193 nm. The size of the microelectronic features patterned on the wafer 120 depends on the wavelength of the light beam 110, with a lower wavelength resulting in a smaller minimum feature size. When the wavelength of the light beam 110 is 248 nm or 193 nm, the minimum size of the microelectronic features can be, for example, 50 nm or less. The bandwidth of the light beam 110 can be the actual, instantaneous bandwidth of its optical spectrum (or emission spectrum), which contains information on how the optical energy of the light beam 110 is distributed over different wavelengths. The scanner 115 includes an optical arrangement having, for example, one or more condenser lenses, a mask, and an objective arrangement. The mask is movable along one or more directions, such as along an optical axis of the light beam 110 or in a plane that is perpendicular to the optical axis. The objective arrangement includes a projection lens and enables the image transfer to occur from the mask to the photoresist on the wafer 120. The illumination system 105 adjusts the range of angles for the light beam 110 impinging on the mask. The illumination system 105 also homogenizes (makes uniform) the intensity distribution of the light beam 110 across the mask.

The scanner 115 can include, among other features, a lithography controller 130, air conditioning devices, and power supplies for the various electrical components. The lithography controller 130 controls how layers are printed on the wafer 120. The lithography controller 130 includes a memory that stores information such as process recipes. A process program or recipe determines the length of the exposure on the wafer 120, the mask used, as well as other factors that affect the exposure. During lithography, a plurality of pulses of the light beam 110 illuminates the same area of the wafer 120 to constitute an illumination dose.

The photolithography system 100 also preferably includes a control system 135. In general, the control system 135 includes one or more of digital electronic circuitry, computer hardware, firmware, and software. The control system 135 also includes memory which can be read-only memory and/or random access memory. Storage devices suitable for tangibly embodying computer program instructions and data include all forms of non-volatile memory, including, by way of example, semiconductor memory devices, such as EPROM, EEPROM, and flash memory devices; magnetic disks such as internal hard disks and removable disks; magneto-optical disks; and CD-ROM disks.

The control system 135 can also include one or more input devices (such as a keyboard, touch screen, microphone, mouse, hand-held input device, etc.) and one or more output devices (such as a speaker or a monitor). The control system 135 also includes one or more programmable processors, and one or more computer program products tangibly embodied in a machine-readable storage device for execution by one or more programmable processors. The one or more programmable processors can each execute a program of instructions to perform desired functions by operating on input data and generating appropriate output. Generally, the processors receive instructions and data from the memory. Any of the foregoing may be supplemented by, or incorporated in, specially designed ASICs (application-specific integrated circuits). The control system 135 can be centralized or be partially or wholly distributed throughout the photolithography system 100.

Figure 2:
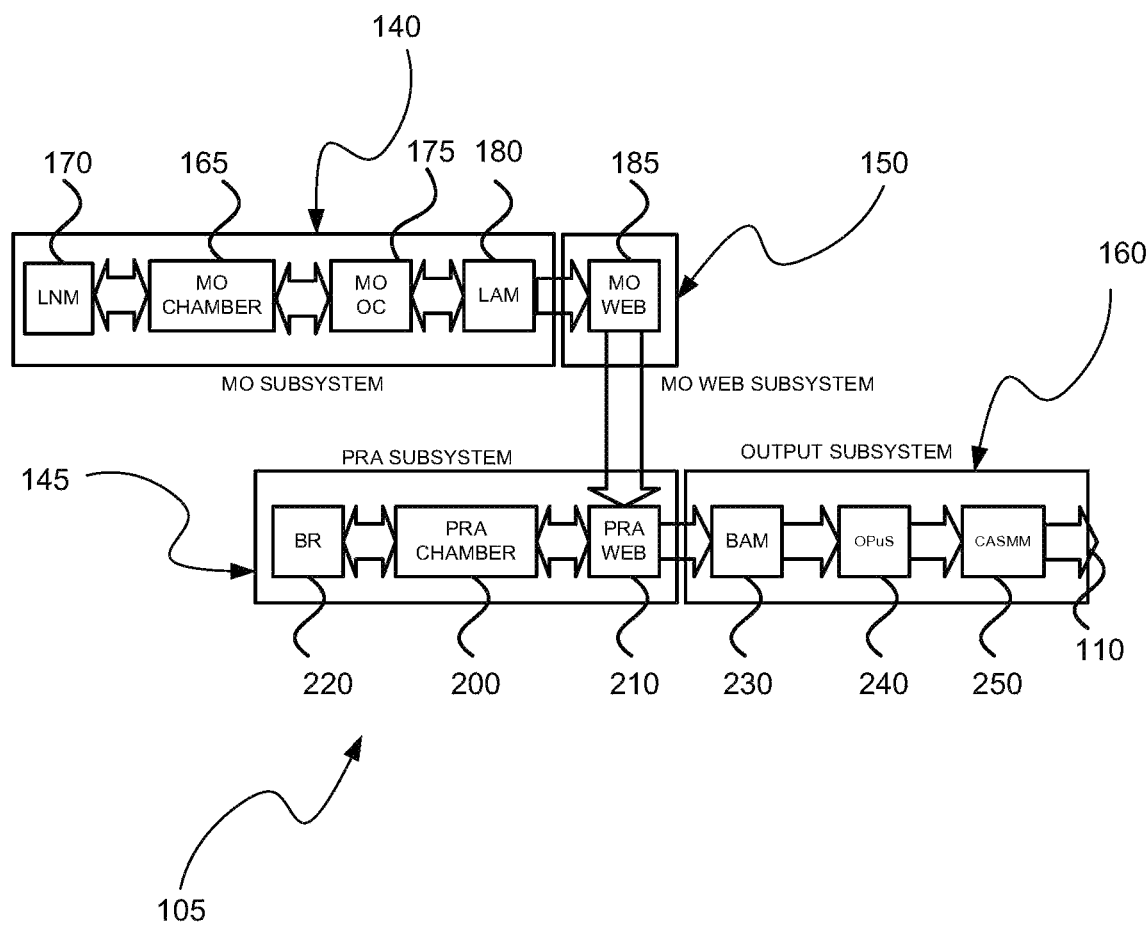
FIG. 2 shows a schematic, not to scale, view of an overall broad conception of an illumination system according to an aspect of the disclosed subject matter.

Referring to FIG. 2, an exemplary illumination system 105 is a pulsed laser source that produces a pulsed laser beam as the light beam 110. FIG. 2 depicts one particular assemblage of components and optical path strictly for purposes of facilitating the description of the broad principles of the invention in general, and it will be apparent to one having ordinary skill in the art that the principles of the invention may be advantageously applied to lasers having other components and configurations.

FIG. 2 shows illustratively and in block diagram a gas discharge laser system according to an embodiment of certain aspects of the disclosed subject matter. The gas discharge laser system may include, e.g., a solid state or gas discharge seed laser system 140, an amplification stage, e.g., a power ring amplifier ("PRA") stage 145, relay optics 150 and laser system output subsystem 160. The seed system 140 may include, e.g., a master oscillator ("MO") chamber 165, in which, e.g., electrical discharges between electrodes (not shown) may cause lasing gas discharges in a lasing gas to create an inverted population of high energy molecules, e.g., including Ar, Kr, or Xe to produce relatively broad band radiation that may be line narrowed to a relatively very narrow bandwidth and center wavelength selected in a line narrowing module ("LNM") 170, as is known in the art.

The seed laser system 140 may also include a master oscillator output coupler ("MO OC") 175, which may comprise a partially reflective mirror, forming with a reflective grating (not shown) in the LNM 170, an oscillator cavity in which the seed laser 140 oscillates to form the seed laser output pulse, i.e., forming a master oscillator ("MO"). The system may also include a line-center analysis module ("LAM") 180. The LAM 180 may include an etalon spectrometer for fine wavelength measurement and a coarser resolution grating spectrometer. A MO wavefront engineering box ("WEB") 185 may serve to redirect the output of the MO seed laser system 140 toward the amplification stage 145, and may include, e.g., beam expansion with, e.g., a multi prism beam expander (not shown) and coherence busting, e.g., in the form of an optical delay path (not shown).

The amplification stage 145 may include, e.g., a lasing chamber 200, which may also be an oscillator, e.g., formed by seed beam injection and output coupling optics (not shown) that may be incorporated into a PRA WEB 210 and may be redirected back through the gain medium in the chamber 200 by a beam reverser 220. The PRA WEB 210 may incorporate a partially reflective input/output coupler (not shown) and a maximally reflective mirror for the nominal operating wavelength (e.g., at around 193 nm for an ArF system) and one or more prisms.

A bandwidth analysis module ("BAM") 230 at the output of the amplification stage 145 may receive the output laser light beam of pulses from the amplification stage and pick off a portion of the light beam for metrology purposes, e.g., to measure the output bandwidth and pulse energy. The laser output light beam of pulses then passes through an optical pulse stretcher ("OPuS") 240 and an output combined autoshutter metrology module ("CASMM") 250, which may also be the location of a pulse energy meter. One purpose of the OPuS 240 may be, e.g., to convert a single output laser pulse into a pulse train. Secondary pulses created from the original single output pulse may be delayed with respect to each other. By distributing the original laser pulse energy into a train of secondary pulses, the effective pulse length of the laser can be expanded and at the same time the peak pulse intensity reduced. The OPuS 240 can thus receive the laser beam from the PRA WEB 210 via the BAM 230 and direct the output of the OPuS 240 to the CASMM 250.

The CASMM 250 is a beam imaging/analysis tool that provides information about beam parameters. The CASMM samples the laser beam to capture both near field and far field profiles of the beam in a single camera image. The near field image is the beam profile at the exit of the laser, and the far field image provides information such as beam pointing and divergence. Distortions of the beam profile are captured by the near field image, which can be studied to detect optical defects. This study requires advanced image processing techniques. Knowledge obtained from CASMM images can be used to determine suitable changes in the system that can help maintain high beam quality.

Figure 3A:
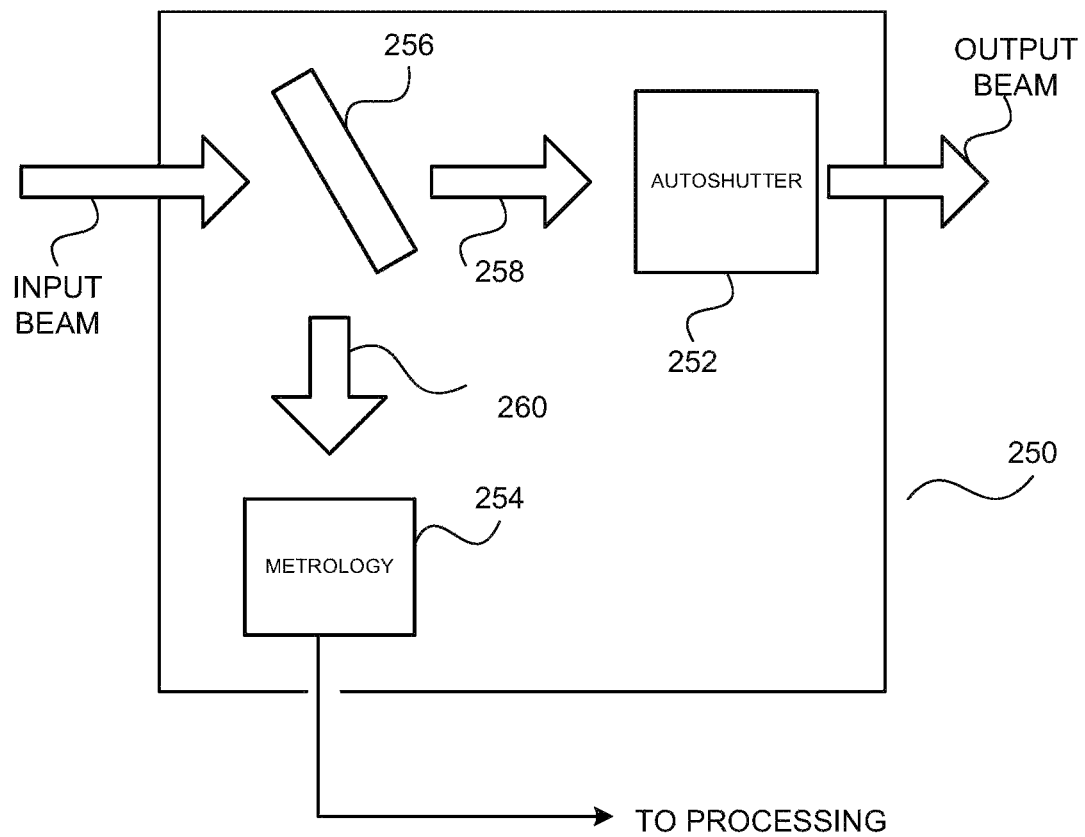
FIG. 3A shows a schematic, not to scale, view of an overall broad conception of an example of a beam imager, a combined autoshutter metrology module ("CASMM").

FIG. 3A is a highly simplified and generalized block diagram of a possible arrangement for the CASMM 250. As shown, the CASMM 250 includes an autoshutter 252 and additional metrology 254 used to monitor laser performance in situ. The CASMM 250 receives an input beam that is split by a beamsplitter 256. The autoshutter 252 is arranged and configured to block the unsplit portion 258 of the laser beam when closed and to allow the laser beam to exit without interference when opened. The autoshutter 252 may include an uncoated $CaF_2$ turning prism using total internal reflection to direct the blocked beam to a water cooled beam dump (not shown).

Figure 3B:
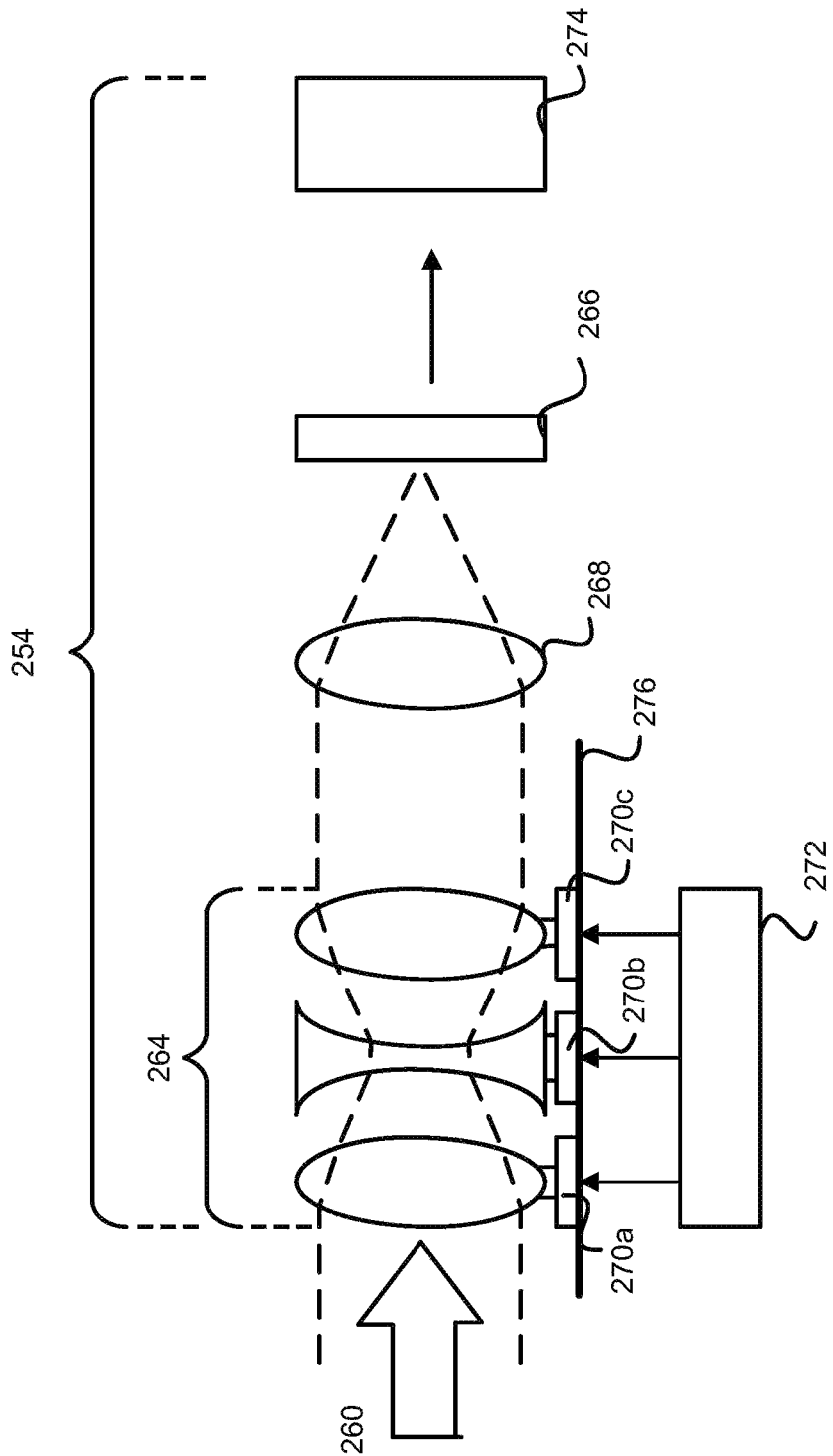
FIG. 3B shows a schematic, not to scale, view of an overall broad conception of an example of a beam imager adapted to obtain images at multiple points along a beam path.

The metrology 254 is arranged to receive the split portion 260 of the beam and preferably includes various photodetectors and position detectors. As shown in FIG. 3B it also preferably includes an optical system 264 and an image sensor 274, e.g., 2D camera, which captures images of the beam, which may be near field and far field 2D images of the beam but can also include intermediate images. Thus, one output of the CASMM 250 is a two-dimensional (2D) cross section of the intensity of the beam profile. This 2D cross section may be used to measure the beam profile and detect distortions or irregularities. The control system 135 collects the data from the 2D camera in the metrology 254. The control system 135 processes the data to derive useful information on beam polarization, profile, divergence, and pointing for immediate observation as well as for longer term storage and retrieval. Immediate observation of the data may be part of field service events on lasers (alignment, troubleshooting). Storage and retrieval may be part of event investigations or trending laser performance over time for preventative maintenance purposes.

The images are captured in a plane normal to the direction of beam propagation. A screen of fluorescent glass 266 of the appropriate irradiation depth and decay time for 193 nm down-conversion to a visible wavelength for camera acquisition is used to create a visible image of the beam. Near and far field 2D imaging is preferably simultaneous and continuous during laser operation. The near field image may be an image of a plane containing a system hard aperture within the OPuS 240.

The near field gives unique information about the irradiance profile, which is a significant characteristic of the beam. The distribution across the cross-section is very important for the lithography industry. Slip planes developing in the bulk of the beam splitters, dendrite growth (degradation of the quality of the beamsplitter coating), misalignment, clamp-induced stress and dust particle contamination have all unique signatures that may be visible in the near field image, or extracted by analysis of the near field image. Another image feature is a short line cluster caused by diffraction by a line defect. This is sometimes referred to as "vertical line damage" even though the orientation of the feature in fact depends on the orientation of the CASMM imager with respect to a particular optic in the PRA WEB and so may not always be vertical. It correlates to observed damage in the optic in the form of a relatively short line that was oriented vertically, hence the name. Evidence of this damage appears in CASMM images in the form of a cluster of relatively short interference fringes.

A beam imaging/analysis tool such as a CASMM as previously implemented is effective for assessing parameters such as laser alignment and polarization ratio. It is also effective to assess the health of optical components in the system such as optical pulse stretchers and beam splitters. However, such tools typically lack the capability to observe the beam at positions along the beam path prior to the optical pulse stretchers and beam splitters. As a consequence, during normal laser operation, when it appears there is a possibility that one or more optical components upstream of the optical pulse stretchers and beam splitters are damaged, there is no ability to accurately specify the location (i.e. module) that is damaged because there is no method for viewing, in situ, the optics, or intensity distribution, in the optical path. There is also no previously utilized method of tracking optical damage, aside from damage in optical pulse stretchers and beam splitters, that permits extrapolation of the amount of damage and proactive replacement of parts.

In order to address these potential issues, it is beneficial to equip a beam imaging/analysis tool such as a CASMM 250 with a lens with variable focal length. This can be, for example, a varifocal lens in which focus changes as focal length (and magnification) changes, or a parfocal ("true") zoom lens, which remains in focus as the lens zooms (focal length and magnification change).

In other words, according to an aspect of the invention, the metrology 254 of the CASMM 250 is provided with a system to dynamically adjust the focal length of the lenses prior to imaging the beam on the fluorescent screen 266. One such system is shown in FIG. 3B. In FIG. 3B, the optical system includes multiple focusing elements including an afocal zoom system 264, which can be a combination of convex and concave prisms as shown. The components of the afocal zoom system 264 can be arranged to move with respect to a focusing lens, which remains fixed.

To provide for movement of the components of the afocal zoom system 264 the lenses could be placed on a track 276, where the position of one or more lenses could be adjusted to vary the focal point. The position of the lenses could be moved for example using drivers 270a, 270b, and 270c which could for example be a stepper or piezoelectric translators (PZT) drivers. A signal to the drivers 270a, 270b, and 270c may be supplied by a local controller 272 equipped with software that could interface with a user to receive commands for movement. Movement of the drivers 270a, 270b, and 270c could also be automated to routinely move the optical elements to collect images in an attempt to create a history and characterize the behavior of the optical components upstream of the CASMM. By varying the focal point, the image on the screen 266 and acquired by the camera 274 will be from different positions along the optical path (e.g. OPuS 240, PRA WEB 210, etc.) and aspects such as intensity distribution of the light at these components can be analyzed. The local controller 272 can be provided with presets that focus the afocal zoom system 264 on preselected positions along the beam path.

This system, if equipped with software or hardware crosshair targets, could also be used to assess the location of the beam hitting the optics at different positions along the laser optical path; a beam located near the edge of a prism could drift when the firing pattern of the laser changes, having the potential to degrade energy and/or bandwidth efficiency.

In another embodiment, one or more sets of fixed lens assemblies can be used in place of the afocal zoom system 264. This is shown in FIG. 3C, in which instead of the afocal zoom system 264 there is a group 265 of fixed lens assemblies 265a, 265b, 265c, 265d, and 265e. The group 265 is shown as having five fixed lens assemblies but it will be apparent to one of ordinary skill in the art that the group 265 may have fewer or more fixed lens assemblies. Also, while each of the fixed lens assemblies is depicted as a lens it will be understood that each fixed lens assembly can be made up of several lenses, prisms, etc. Fixed lens assemblies 265a might be the conventional fixed lens assembly that focuses on the output aperture, fixed lens assembly 265b may be selected to focus on a first optic upstream (i.e., earlier in the beam path) from the output aperture, fixed lens assembly 265c focuses on a second optic upstream from the output aperture, and so on. The local controller 272 controls a lens positioner 273 to position the desired fixed lens in the beam path. Motion of the group 265 to selectably place one of the fixed lens assemblies in the optical path is preferably transverse to the optical axis (direction of propagation of the beam 260), in contrast to the variable focal length lens control system that preferably is arranged to translate optics along the optical axis.

The above system improves the ability to predict optical failure and so scheduling of service events to minimize interference with customer operations and reduce unanticipated laser downtime. As noted, the system is preferably placed in the metrology 254 of the CASMM 250. This provides the ability to focus on multiple desired positions in the beam path. In other words, the beam at this position has traversed essentially all of the optics in the output subsystem so the metrology can essentially "see" many of these optics from this position. Also, the system may be configured through the use of presets in the system shown in FIG. 3B or selection of fixed lenses in the system shown in FIG. 3C to focus on known position of optical elements in the illumination system 105.

Many of the modules described above include provision for aligning the module and/or the optics within it. As used here and elsewhere in the specification, including the claims, "optical element" means a module or an optic in the module. Similarly, to incrementally adjust an optical element means to change the position and/or orientation of the optical element in one or more negative or positive increments that are small compared to an overall range of adjustment of the position or orientation of the optical element. As examples of incrementally adjustable optical elements, the LNM 170 may include provision for adjusting the position of its vertical tip. The tip and/or tilt of the MO OC 175 is preferably adjustable. The MO WEB 185 may include a folding mirror having an adjustable tip or tilt. The BR 220 may include a prism that has an adjustable horizontal translation and tilt. The PRA WEB 210 may have an optical output coupler that is adjustable and/or a folding mirror having an adjustable tip or tilt.

Typically adjustments on these components are carried out using a respective through-the-wall adjustor ("TWA"). These require a hand-manipulated hex driver to tip or tilt or translate an optic or module. TWAs may provide a sealed mechanical feed through to certain adjustments, e.g., accessed through the covers via a sealed mechanical feedthrough.

According to one aspect of the presently disclosed subject matter, adjustment is carried out with an electrically actuated TWA instead of a manually actuated TWA. A motor is mechanically coupled to the TWA. For example, the motor may have a shaft to which a hex adaptor is attached so that when the motor turns the shaft, the hex driver also turns, causing the end of the TWA to translate along its axis according to the direction of rotation of the shaft. Preferably, the motor is a stepper motor that can be turned in either direction in a number of discrete steps. The TWA preferably has a very fine (e.g., ¼-80) thread pitch so that the stepper motor requires a relatively large number of steps to move the TWA a small distance.

Figure 4:
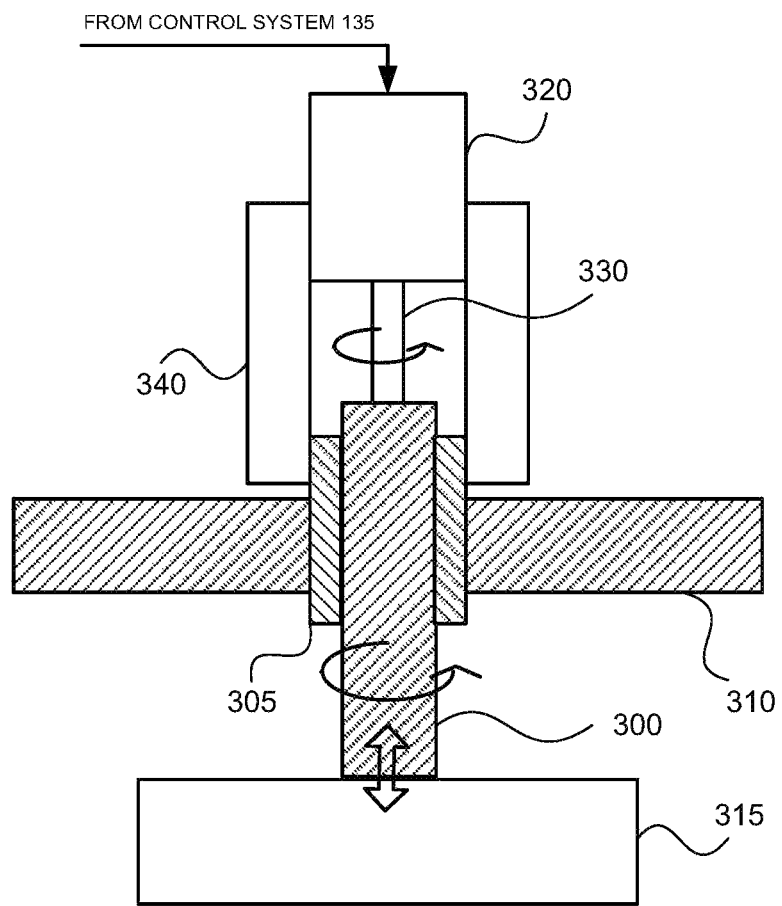
FIG. 4 shows a schematic, not to scale, view of a partially cut away view of an overall broad conception of an electrically actuated through-the-wall adjuster according to an aspect of the disclosed subject matter.

Such an arrangement is shown in FIG. 4. In FIG. 4, TWA 300 protrudes through a bushing 305 in a module wall 310 and is mechanically coupled to an optical feature 315 to control some aspect (e.g., position, tilt, tip) of the optical feature 315. The optical feature may be an optical element or all or part of an optical element as described above. The TWA 300 is rotated about its axis by a motor 320 to induce a lengthening or shortening of the TWA 300. The motor 320 is mechanically coupled to the TWA 300 by a shaft 330. In the case where the TWA 300 is of an existing design with a female hex socket, the shaft 330 may be provided with a male hex driver tip. The motor 320 is secured to the module wall 310 by a clamping arrangement 340 which, as shown, may clamp onto the bushing 305 to restrict relative movement of the motor 320 and the TWA 305. The motor 320 receives control signals from the control system 135 as shown and is connected to a power source (not shown).

Figure 5:
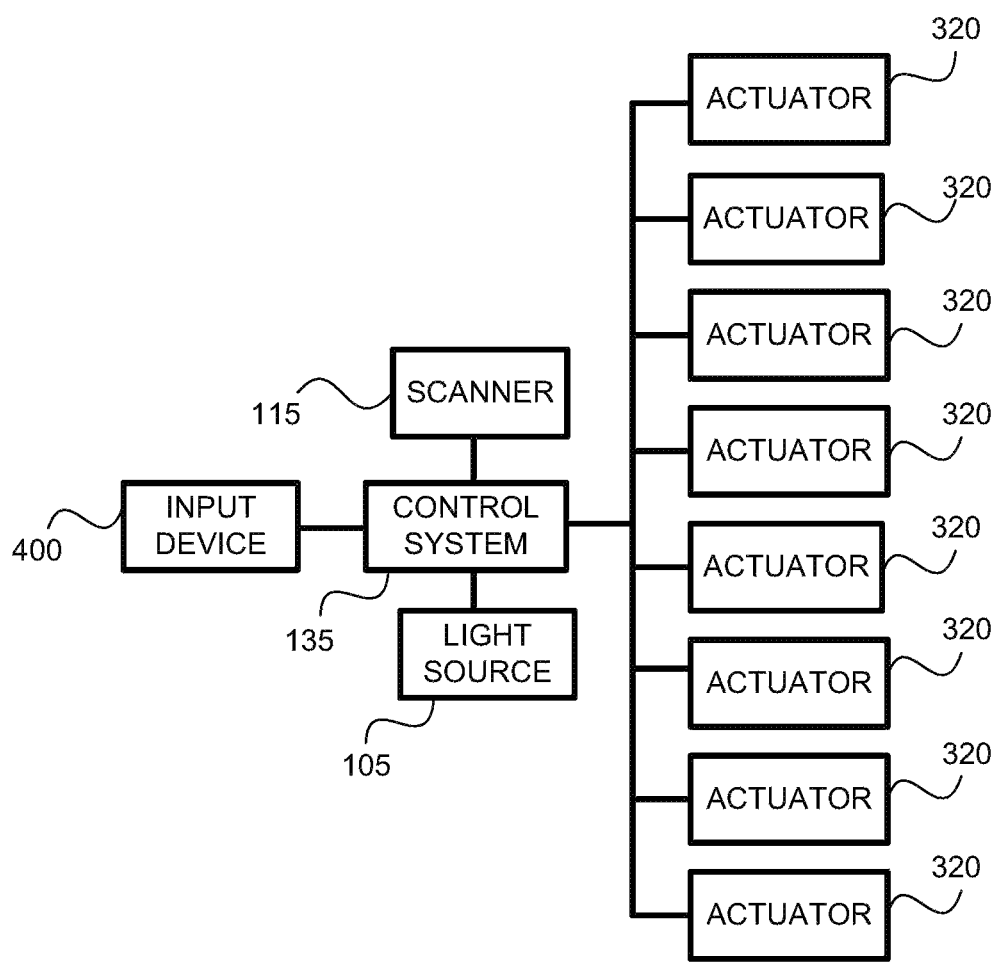
FIG. 5 shows a schematic, not to scale, partially cut away view of an overall broad conception of a system for controlling a group of actuators for electrically actuated through-the-wall adjusters according to an aspect of the disclosed subject matter.

As shown in FIG. 5, the overall system can include a number of actuators 320. As described above, the actuator 320 may be a stepper motor, but other devices could be used, for example, motors that are not stepper motors, or valves, pressure-controlled devices, piezoelectric devices, linear motors, hydraulic actuators, voice coils, etc. As shown, the actuators 320 are arranged to be under the control of the control system 135. During alignment, for example, the control system 135 applies signals directly or indirectly to the actuators 320 to cause the actuators to put their respective optical feature 315 in a properly aligned position and/or orientation. In some steps of the alignment procedure, the control system 135 causes an actuator to insert an optical element with a fluorescent screen into the beam line and within the field of view of a small camera, so that alignment up to that element can be performed and verified. This alignment could be carried out in any one of several operational modes. For example, as described in more detail below, alignment could be carried out in a manual mode, a semi-automatic mode, a full automatic mode, a light source directed mode, or a scanner directed mode.

For example, in a manual mode, a user could adjust individual actuators 320 via an input device 400 with a computer-based interface such as a graphical user interface ("GUI"). In some implementations, the GUI may be configured to display information about a beam profile as detected at one or more locations along an optical path in a laser source. The locations may be those for which the near field or far field images are obtained or, if the beam analysis and imaging tool has variable focus is described elsewhere in the specification then additional locations may be used. For example, the beam profile information profile may include a 2-dimensional intensity map, other intensity information, beam width information, or other profile information. The beam profile information may be obtained by illuminating a phosphorescent surface with a beam or a portion of a beam, and/or by receiving information from a metrology module (such as CASMM 250, for example). This information may be usable, for example, for obtaining diagnostic information and/or for making manual adjustments to optical elements in the laser source. As another example, in a semi-automatic mode combinations of actions could be initiated with a single user input from the input device 400. Such actions could, for example, include an automatic sweep of selected actuators to complete one of the tasks in an alignment sequence. As another example, in an automatic mode an automatic completion of a sequence of tasks in an alignment protocol could be completed. In various implementations of a semi-automatic mode or an automatic mode, one or more actions may be based at least in part on beam profile information. In various implementations of a semi-automatic mode or an automatic mode, beam profile information may be gathered and adjustments may be made based on a request signal received from a scanner that receives light from the light source.

As another example, in a light source directed mode one or more optics could be adjusted based on image data from the CASMM 250 in light source 105. For example, adjustment could be based on correcting for diffraction fringes using the CASMM 250 to monitor the beam. Here and elsewhere, adjustment is intended to include realigning and/or repositioning a lens, mirror, prism, or other optic; modifying a timing of events or measurements; modifying a schedule of maintenance events; among others; or combinations thereof.

If the beam is diffracting off an aperture, for example, then the fringes can be detected in a near field image from the CASMM 250. These fringes can be suppressed, for example, by adjusting one or more mirrors using an electrically actuated TWA 320.

Figure 6:
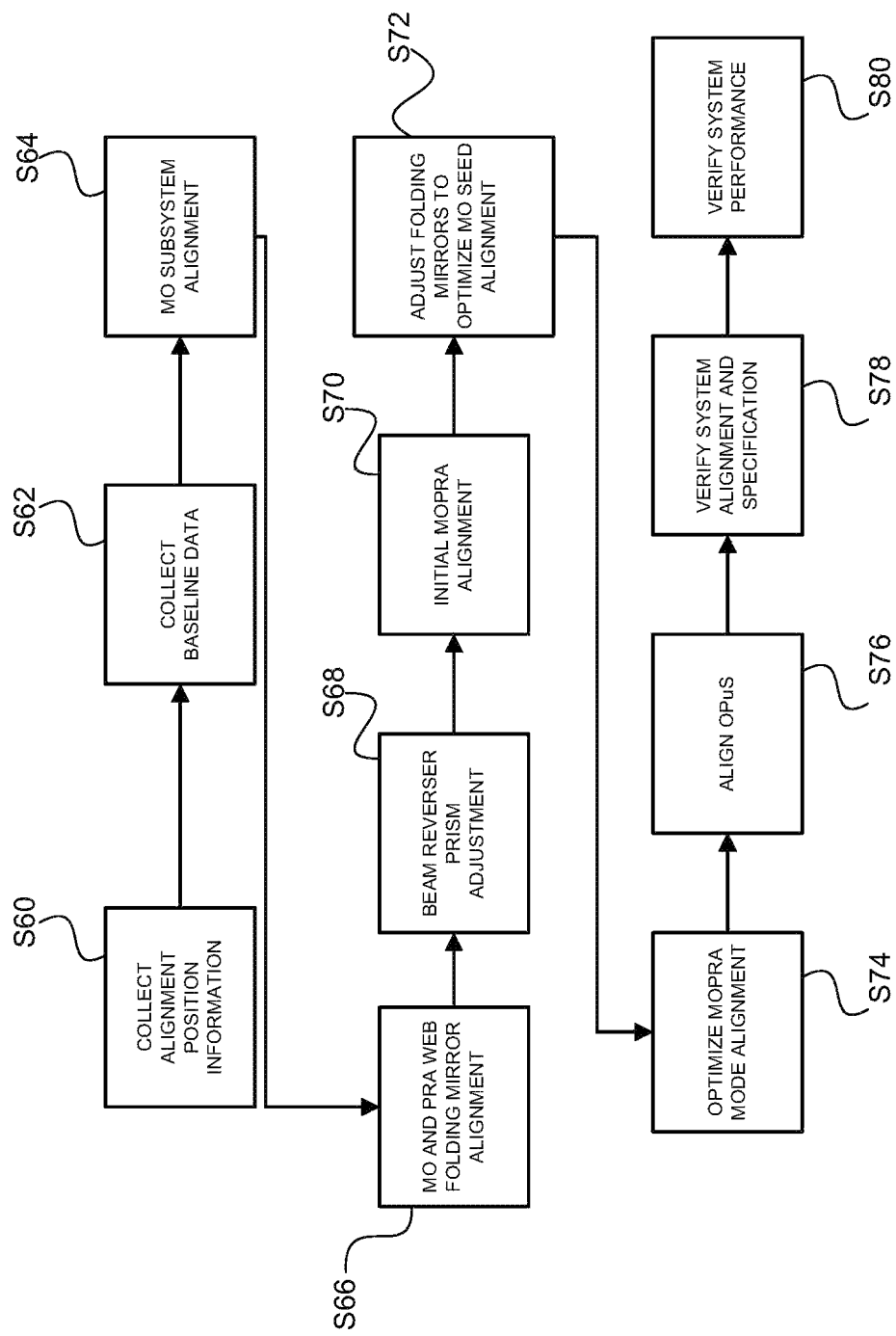
FIG. 6 is a flow chart depicting a method of aligning components in an illumination system according to an aspect of the disclosed subject matter.

A possible alignment procedure is shown in FIG. 6. In a step S60 initial alignment position information is collected. In a step S62 baseline data is collected. Then, various subsystems and optics may be aligned. For example in a step S64 the MO subsystem 140 may be aligned. Then the folding mirrors in the MO WEB 185 and PRA WEB 210 may be aligned in a step S66. Then a prism in the beam reverser 220 may be adjusted in a step S68. Then initial adjustment of the MOPRA can be performed in a step S70. In a step S72, adjustments can be carried out using a fold mirror to optimize MO seed alignment. Then MOPA mode alignment can be optimized in a step S74. Then the OPuS 240 may be aligned in a step S76. The final alignment and specification may then be verified in a step S78. Then overall system performance may be confirmed in a step S80.

Figure 7:
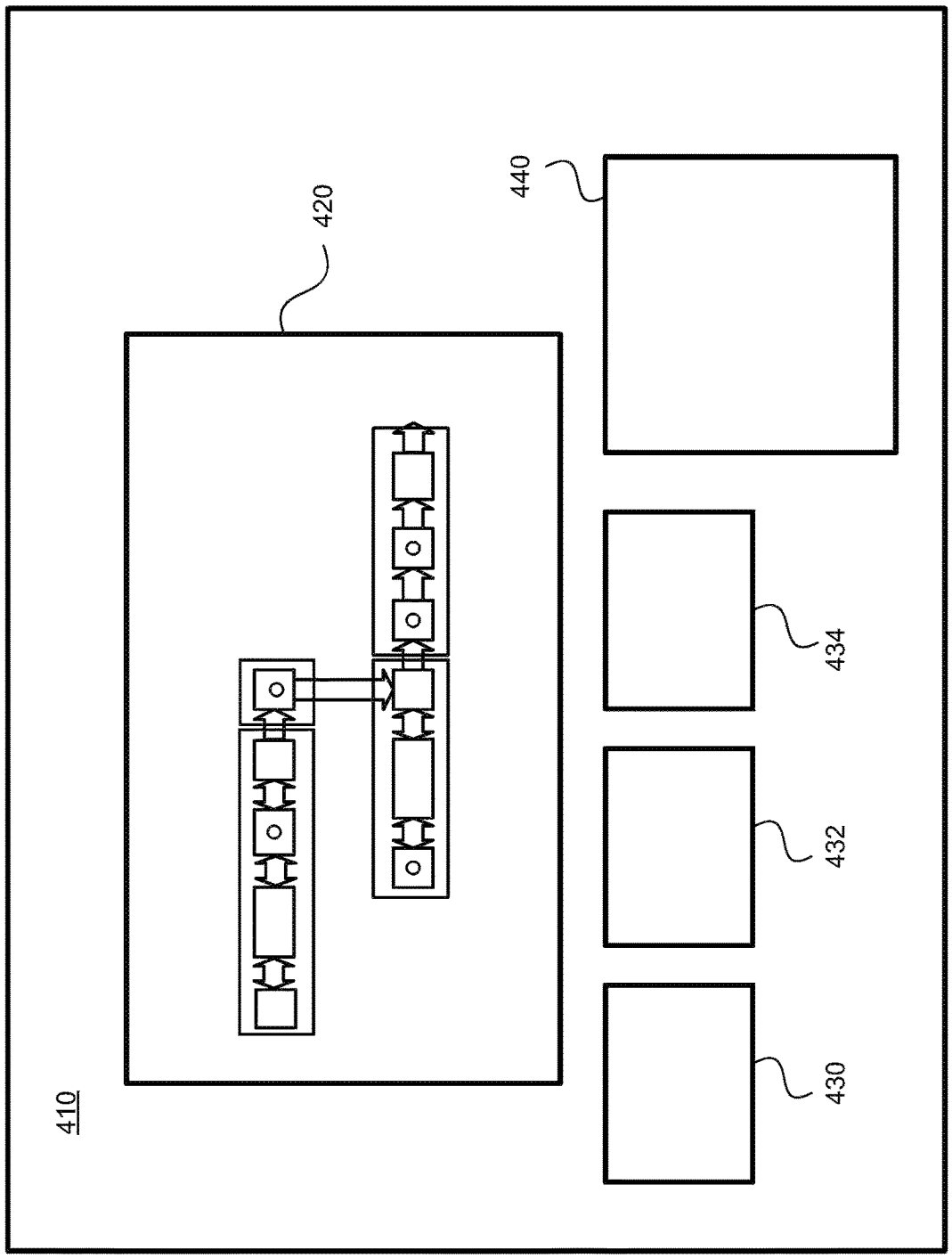
FIG. 7 is a graphical representation of an overall broad conception of a GUI for controlling a one or more actuators for electrically actuated through-the-wall adjusters according to an aspect of the disclosed subject matter.

As mentioned, the alignment system may be operated according to any one of several modes. In a manual mode, the user, such as a technician or a field service engineer, may use input device 410 in the form of a GUI as shown in FIG. 7 to directly modify the position and/or orientation of available optics. As shown, the GUI may include a graphical representation 420 of which electrically actuated TWA is being adjusted, with intensity profiles, such as an image of a fluorescent screen, or other beam properties in graphical representations 430, 432, and 434, and the 2D image 440 from the CASMM 250. While in the example shown there are three graphical representations it will be understood that fewer or more graphical representations could be provided.

The alignment system may also be operated in a semi-automatic mode in which the user may initiate combinations of actions with a single input. Such actions could range from including automatic sweeps of selected actuators to completing one of the tasks in the task sequence shown in FIG. 6.

It should be noted that for alignment, it may be preferred to use not only the near field image but also to use the far field image. The far field image may be used, for example, to determine whether the light beam is pointing in the proper direction.

Figure 8:
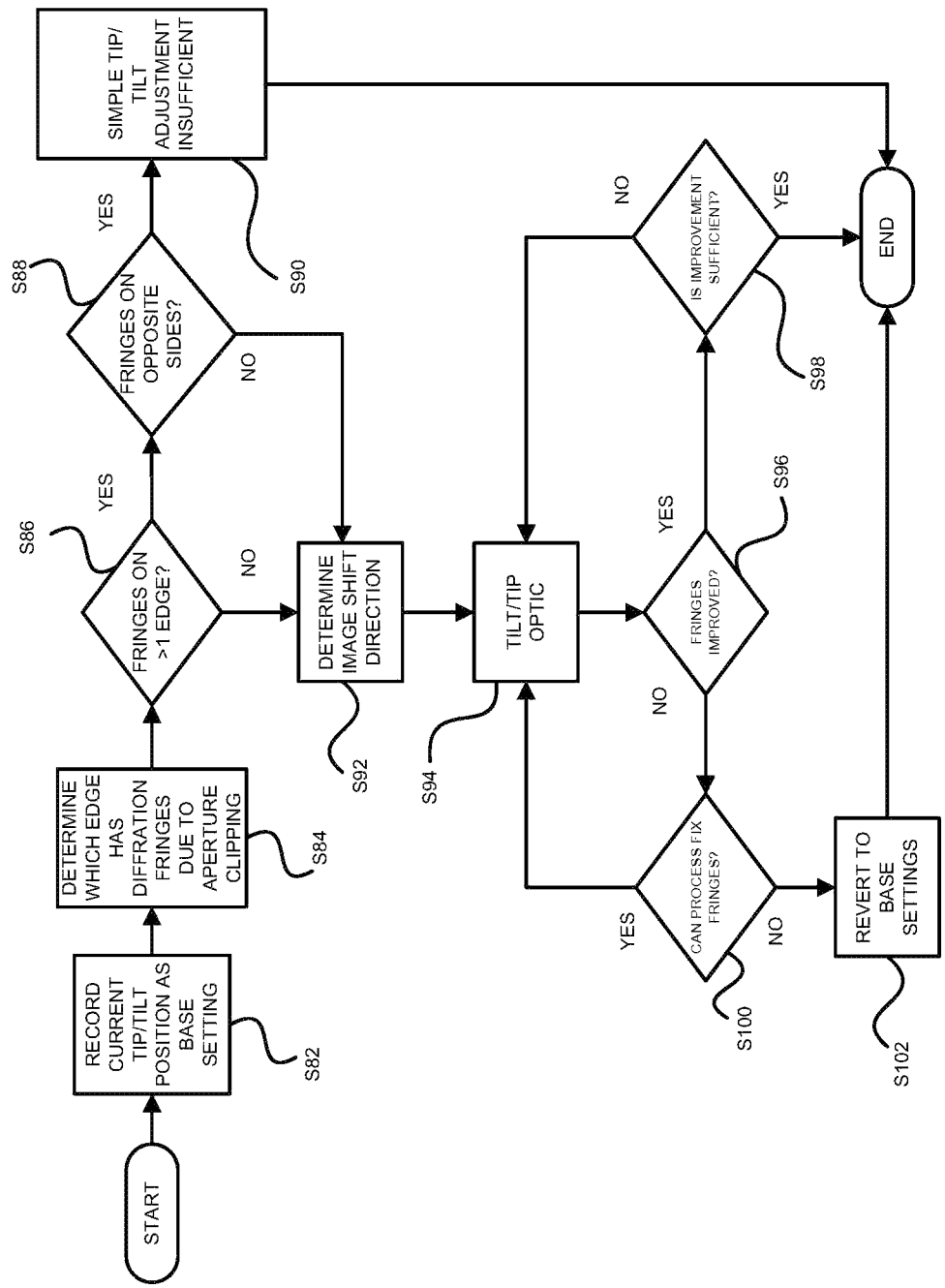
FIG. 8 is a flow chart depicting a method of correcting aperture clipping according to an aspect of the disclosed subject matter.

FIG. 8 is a flow diagram for a process for correcting for diffraction fringes from aperture clipping. Though shown in the figure and described below as applying to a single optic, it will be understood that this process can be applied systematically and sequentially to more than one optical element. In a step S82, a current state of an optical element such as a mirror with respect to its available degrees of freedom (e.g., tip/tilt/translation is recorded as a base setting. In a step S84, a determination is made as to which edge or edges in the near field image exhibit diffraction fringes due to aperture clipping. The near field image is rectangular, so all four sides are examined for the presence of diffraction fringes. In a step S86 a determination is made as to whether there are diffraction fringes on more than one edge of the near field image. If there are, then a determination is made in a step S88 as to whether the fringes are on opposite sides of the near field image (vertical or horizontal). If the determination in step S88 is affirmative, then it is assumed in a step S90 that a simple adjustment of the tip or tilt of the optical element will be insufficient to resolve the aperture clipping completely since the beam overfills the aperture. Small adjustments in the tip or tilt angle of the optical element may be done to balance the extent of diffraction fringes subject to the constraint that the energy centroid and pointing direction of the beam remain within specification, and the process is terminated. If, on the other hand, it is determined in step S88 that the diffraction fringes are not on opposite sides but are instead on adjacent edges, then the logic of the process moves to a step S92 with the knowledge that adjustments in two directions may be made. In step S92 the image shift direction is horizontal and vertical if the assessment of step S88 is that two adjacent edges exhibit diffraction fringes, and horizontal or vertical if the assessment of step S86 is that diffraction fringes are present on only one side. The logic of the process moves to a step S94 in which the optic is tipped and tilted, or only tipped or tilted in accordance with the image shift direction deduced in step S92. In a step S96 it is determined whether the action taken in step S94 improved the fringes, i.e., suppressed them, indicating at least partial alleviation of aperture clipping. If yes, and it is determined in a step S98 that the improvement is sufficient, then the process ends. If it is determined in step S98 that the improvement is not sufficient then the process flow returns to step S94. If it is determined in step S96 that the fringes did not improve, then in a step S100 a determination is made as to whether the process can be expected to work. If yes, then the process flow returns to step S94. If not then in a step S102 the tip/tilt/translation state of the optical element is returned to the base settings recorded in step S82 and the process ends. If the image shift direction determined in S92 indicates that adjustments in two directions are needed (due to the presence of fringes on adjacent edges determined in S88), then the actions described for S94, S96, S100, S102, and S98 are done for each adjustment direction.

As another example of possible operation in a light source directed mode, adjustment could be based on correcting damage, e.g. the formation of slip planes in an optic, which induces spatial bias in a beam parameter, such as beam centroid. As with the previous example, the near field image from the CASMM 250 would be analyzed. If there indications of the formation of slip planes, then one or more optical elements could be adjusted to re-center the beam.

Figure 9:
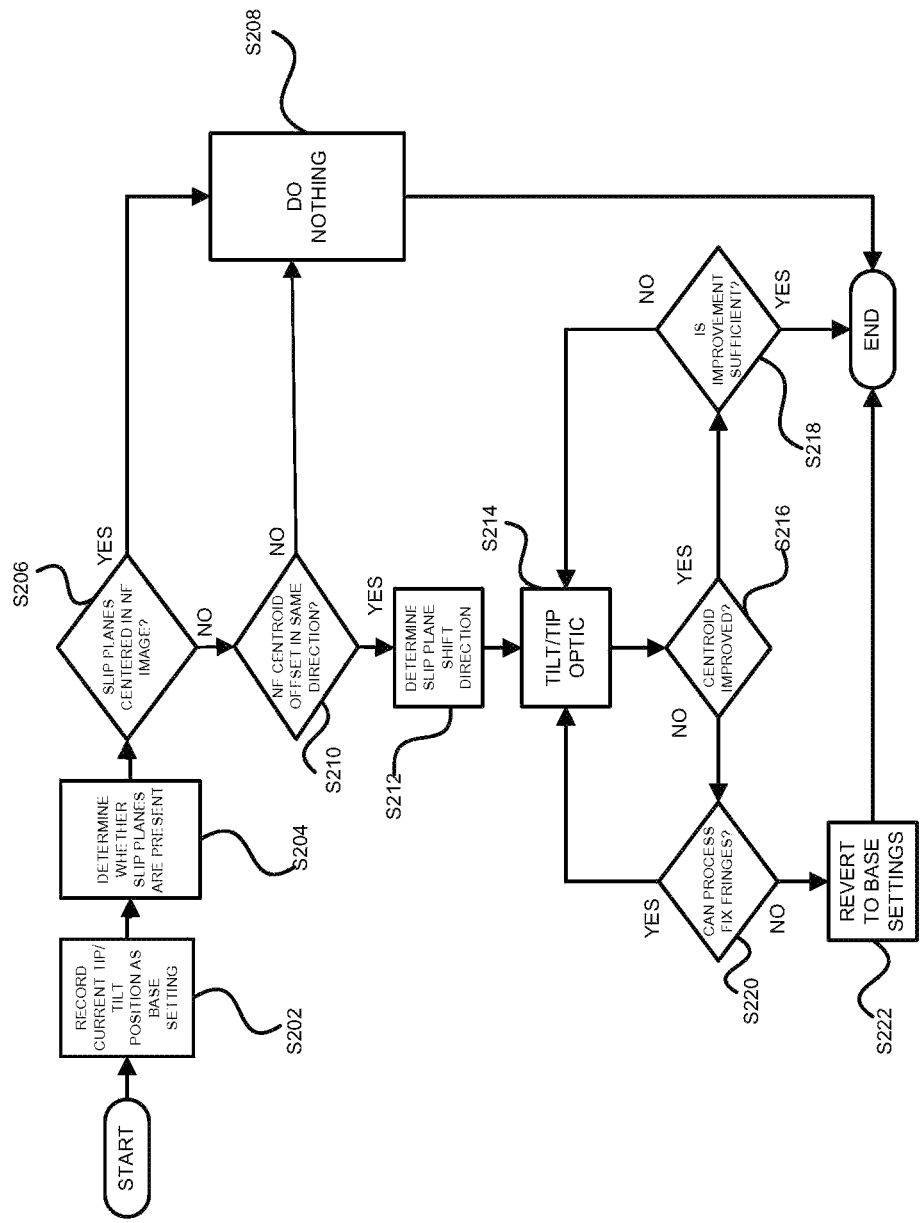
FIG. 9 is a flow chart depicting a method of correcting a centroid shift according to an aspect of the disclosed subject matter.

FIG. 9 is a flow diagram for a process for compensating for shift in the beam centroid due to slip planes. Though shown in the figure and described below as applying to a single optic, it will be understood that this process can be applied systematically and sequentially to more than one optical element. In a step S202, a current state of an optical element such as a mirror with respect to its available degrees of freedom (e.g., tip/tilt/translation) is recorded as a base setting. In a step S204, a determination is made as to whether slip planes are present. This can be accomplished using a process such as described in more detail below in connection with FIG. 12. In a step S206 a determination is made as to whether the slip planes are centered in the near field image or whether they are instead offset from the center of the near field image. If the slip planes are centered in the near field image then a determination is made in step S208 to take no action and the process is terminated. If the slip planes are not centered in the near field image then a determination is made in step S210 whether the centroid of the near field image is offset in the same direction as the slip plane offset. If the centroid of the near field image is not offset in the same direction as the slip plane offset then a determination is made in step S208 to take no action and the process is terminated. If the centroid of the near field image is offset in the same direction as the slip plane offset then a slip plane shift direction is determined in step S212. The logic of the process moves to a step S214 in which the optic is tipped and tilted, or only tipped or tilted in accordance with the slip plane shift direction deduced in step S212. In a step S216 it is determined whether the action taken in step S212 improved the position of the centroid. If yes, and it is determined in a step S218 that the improvement is sufficient, then the process ends. If it is determined in step S218 that the improvement is not sufficient then the process flow returns to step S214. If it is determined in step S216 that the centroid did not improve, then in a step S220 a determination is made as to whether the process can be expected to work. If yes, then the process flow returns to step S214. If not then in a step S222 the tip/tilt/translation state of the optical element is returned to the base settings recorded in step S202 and the process ends.

Note that although this process is described as correcting for a centroid shift due to slip planes its principles are not specific to correcting for a centroid shift due to slip planes and the process may also advantageously applied to correcting centroid shifts due to other factors, e.g. the onset of white fuzz on the beam footprint due, for example, to compaction under high UV fluence to the $CaF_2$ optics.

Figure 10:
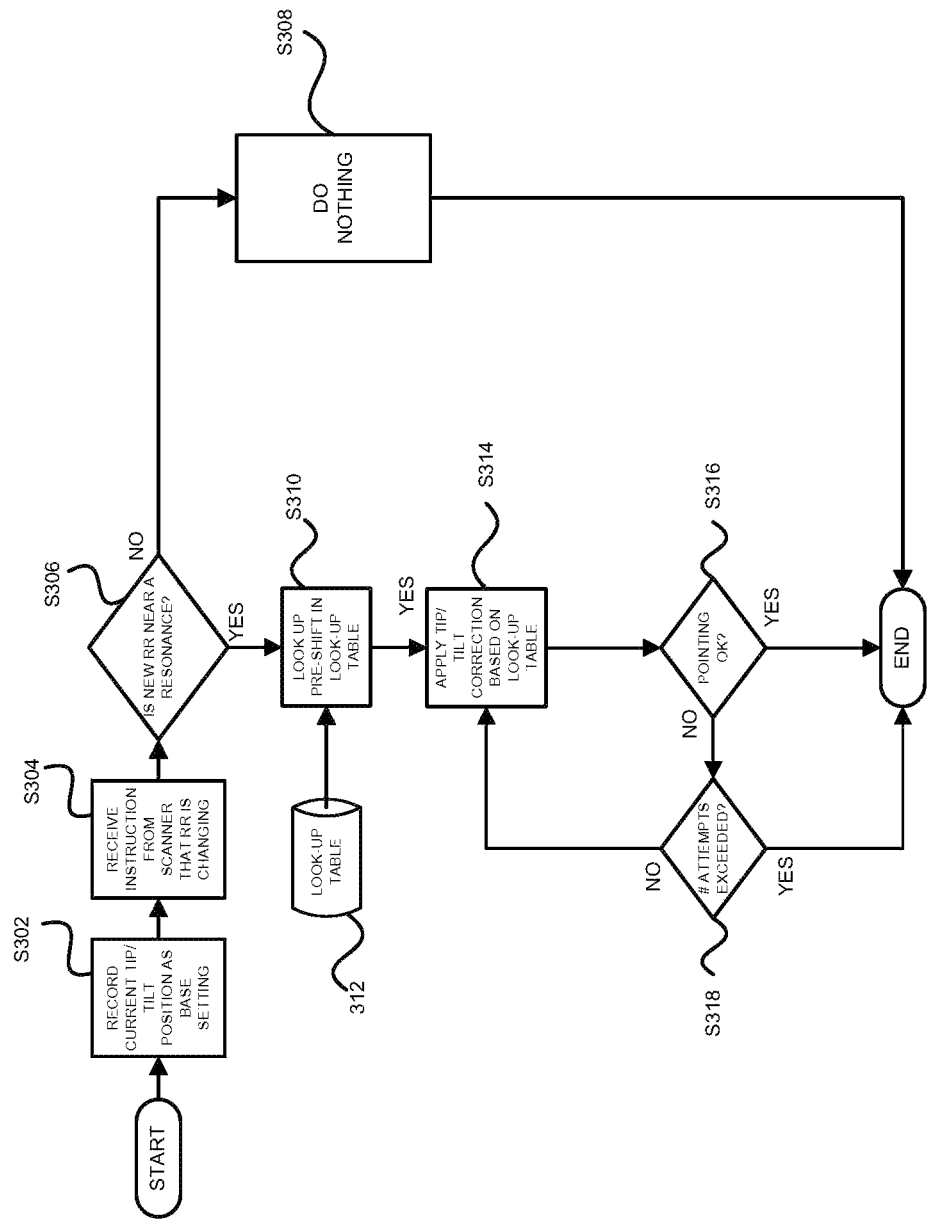
FIG. 10 is a flow chart depicting a method of correcting for a chamber resonance according to an aspect of the disclosed subject matter.

As another example of a possible operating mode, in a scanner directed mode the scanner could command the use of a particular repetition rate that falls near a chamber resonance frequency. In such circumstances the light source could respond by adjusting one or more optics to improve pointing by reducing the pointing total included range ("TIR"). FIG. 10 is a flow diagram of a process by which the light source may compensate for excessive pointing (i.e., the pointing TIR is larger than a specified value) if the scanner commands operation at a repetition rate that corresponds to a chamber resonance. The process involves tipping and/or tilting the PRA OC to compensate for excessive pointing. Either the resonance peak is lowered, or the floor is raised, or a combination of the two is effected so that the TIR is reduced. It is advantageous to use a lookup table to provide pre-determined tip/tilt adjustment values to minimize the time necessary to compensate for the effect of the resonance peak.

More specifically, as shown in FIG. 10, in a step S302, a current state of an optical element such as a mirror with respect to its available degrees of freedom (e.g., tip/tilt/translation) is recorded as a base setting. In a step S304, a determination is made whether the scanner has requested a new repetition rate ("RR" in the figure). In a step S306 a determination is made as to whether the new repetition rate is near a resonance frequency for the chamber. If the new repetition rate is not near a resonance frequency for the chamber then a determination is made in a step S308 to take no action and the process is terminated. If the new repetition rate is near a resonance frequency for the chamber then in a step S310 a pre-shift value is looked up in a look-up table 312. This pre-shift value is selected to provide optimum compensation for the resonance. More specifically, the pre-shift value is one that has been determined a priori, i.e. through rigorous system characterization and production calibration. One way to do this involves performing a careful optical alignment and recording the position of adjustable optics as base settings. This process is done off-line, but is otherwise the same as the first step in FIG. 10. Operating conditions such as rep rate and duty cycle are varied over a range of use cases, and their influence on performance parameters recorded. Adjustments to selected optics that improve performance parameters, especially in the neighborhood of a resonant frequency, are then made and the respective positions of the adjustable optics are recorded. This process is repeated over a range of operating conditions, which creates the look-up table.

The logic of the process moves to a step S314 in which the optic is tipped and tilted, or only tipped or tilted in accordance with the value for the pre-shift obtained in step S310. In a step S316 it is determined whether the action taken in step S314 improved the pointing sufficiently. If yes, then the process ends. If it is determined in step S316 that the improvement is not sufficient then the process goes to step S318 in which it is determined whether a maximum number of allowed attempts to improve pointing have been exceeded. If not, then the process reverts to step S314. If the maximum number of attempts has been exceeded, then the process ends. As modules and optical elements age, the tip/tilt settings stored in the look-up table 312 may no longer provide optimum compensation for the resonances, so a step S318 provides for optimizing compensation for the resonance effect. CASMM images may also be used to monitor divergence, and to detune the OPuS 240 to improve divergence performance.

It should be noted that prior to this invention any adjustment in pointing required taking the tool out of production, which meant lost revenue for the chip maker. One benefit of this invention is that a correction can be made during pauses in production, e.g. between wafer exposures. Also, depending on which auto-alignment mode is being used, a pointing correction can be made during a tool-down event, but take much less time than would be required using purely manual adjustment.

As described, in a system according to one aspect of the present disclosure there is provision for automatic parsing, extraction and processing of near field CASMM images. This provides the capability of monitoring for the onset of defects. The detection of very low-contrast features such as lines and circular objects in images requires techniques beyond basic image processing techniques. Laser beams are heavily distorted and the task of automatic detection of rings or lines is not straightforward. The complexity of the problem is mainly due to the fact that the low-contrast lines and rings reside on top of a heavily distorted beam profile. But by tracking the intensity of low level features in CASMM images it is possible to monitor the evolution of component failures, quantify image distortions related to slip planes, and estimate various levels of component failures. It is also possible to correlate quantified image distortions with CASMM log data and identify new signatures correlated with other deterioration mechanisms.

Figure 11:
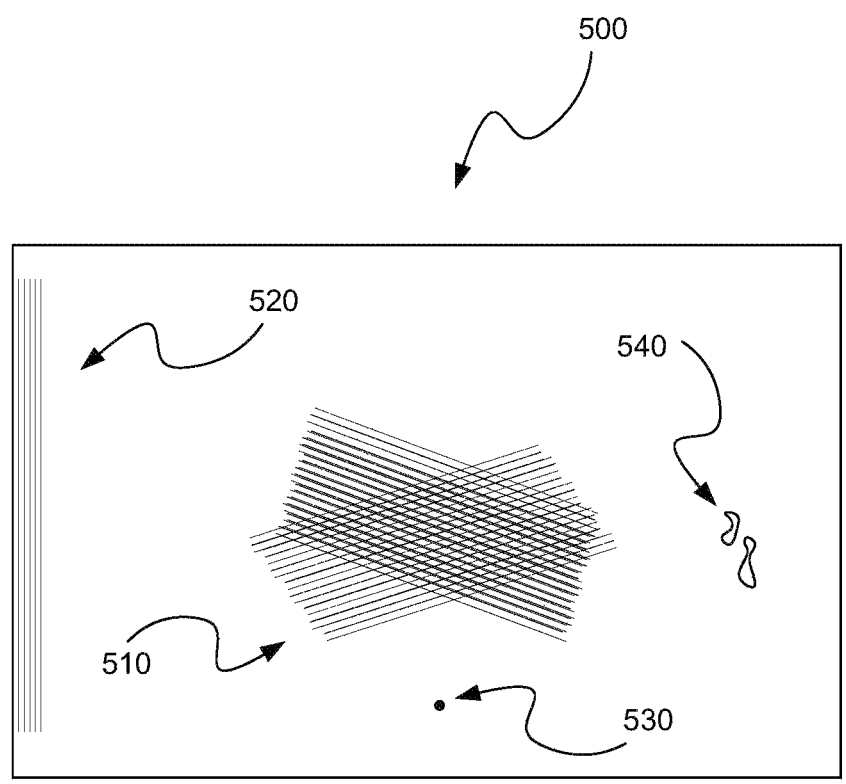
FIG. 11 is a graphical representation of features possibly present in a CASMM near field image.

Several of the above processes used to determine a condition in situ such as the presence of slip planes involve the use of a combined auto-shutter metrology module 250 or CASMM 250. The CASMM 250 attaches to the illumination source 105 at the light source exit port. Among its functions is the ability to acquire in a single image the near field and the far field. In the examples above the near field is used. By carefully inspecting near field images, it is possible to perceive very faint, straight lines at selected angles, e.g. ±15° or ±30°. These are depicted graphically in the representation of a CASMM near field image 500 in FIG. 11 as feature 510. However, these lines are difficult to see and easy to overlook. Also in FIG. 11 the presence of aperture clipping can be expected to manifest itself as a series of vertical or horizontal lines at one or more of the edges of the CASMM near field image 500. This is represented in FIG. 11 as feature 520. Also in FIG. 11 the presence of a point-like defect can be expected to manifest itself as a circular image or "ring" in the CASMM near field image 500. This is represented in FIG. 11 as feature 530. As with slip planes, these features are difficult to see and easy to overlook, and at present there is no way to detect them automatically, nor is it currently possible to monitor the progression of the defects creating these features over time. FIG. 11 also shows the so-called "worm-like" features described above that are also associated with optical damage of one or more components through which the laser beam passes. This is represented in FIG. 11 as feature 540.

Figure 12:
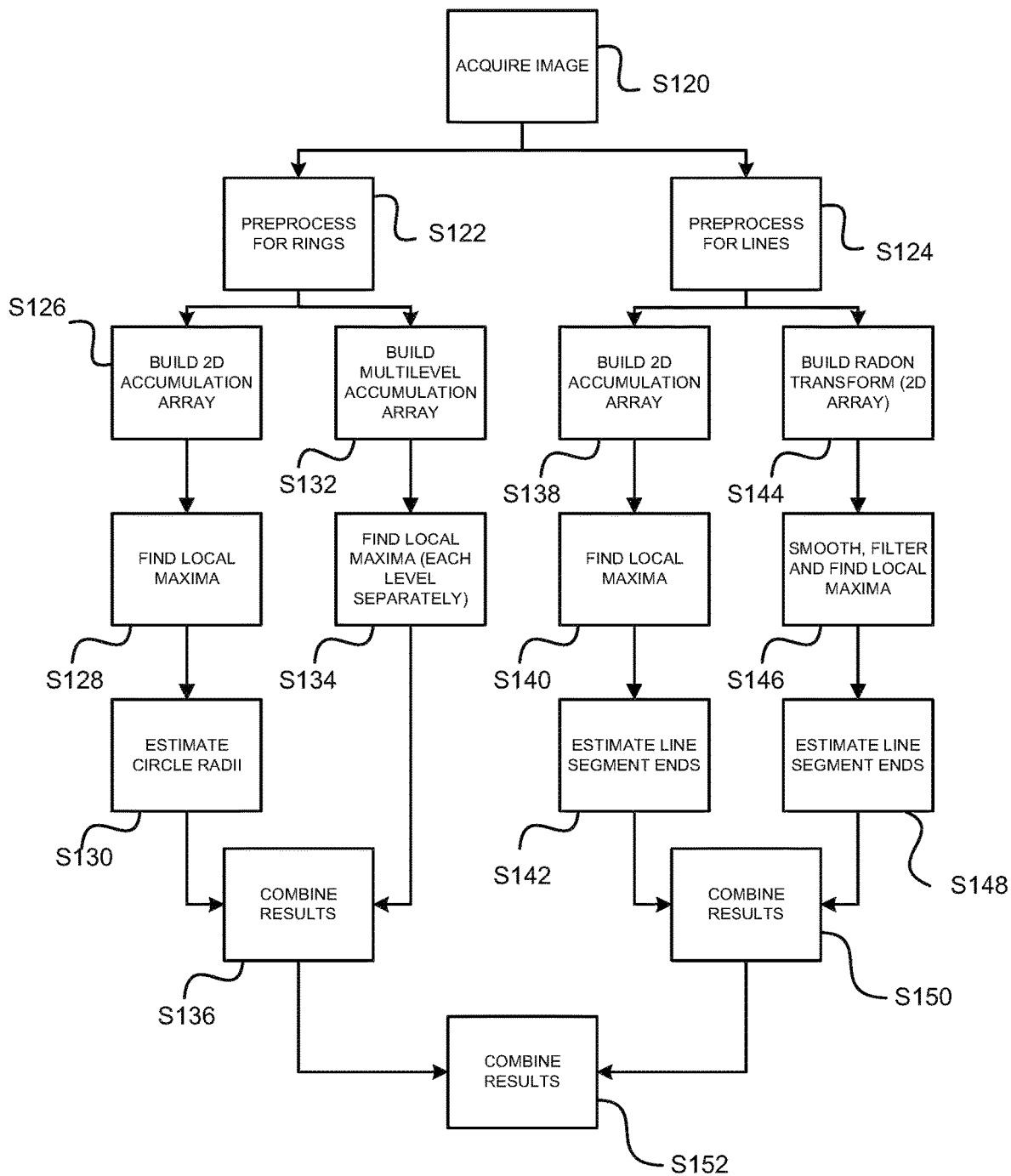
FIG. 12 is a flow chart depicting a method of extracting features possibly present in a CASMM near field image according to an aspect of the disclosed subject matter.

FIG. 12 shows a method enabling the detection of slip plane lines and rings separately. Referring to FIG. 12, processes on the left side of the flow chart are used for detecting interference rings while processes on the right side of the flow chart are used for detecting slip planes. Step S120 in the first block in FIG. 12 is image acquisition; which involves retrieving the image from the CASMM 250 and extracting the near field image. As mentioned, the near and far field 2D images are captured in a plane normal to the direction of beam propagation. A screen of fluorescent glass is used to create a visible image of the beam. An image sensor such as a 2D camera captures near field and far field 2D images of the beam. The near field image is then processed at a preprocessing step S122, for detecting interference rings. A similar preprocessing step S124 is performed for detecting slip planes. The preprocessing step S122 for detecting interference rings is essentially the same as the preprocessing step S124 for detecting slip planes except that the frequency responses may be different depending on the type of feature being detected. The image data first preferably passes through an unsharp filter. The unsharp filter is a simple sharpening operator which derives its name from the fact that it enhances edges (and other high frequency components in an image) via a procedure which subtracts an unsharp, or smoothed, version of an image from the original image. It is sometimes referred to as the negative of the Laplacian filter. The image data then passes through a band pass filter that eliminates undesirable frequencies. The frequency response of the band pass filter may be selected empirically to obtain the most distinct distortions in the output image. Thus, the frequency response which may be used to detect interference rings may be different from the frequency response used to detect linear features such a slip planes lines. The output of the bandpass filter has a histogram (pixel intensity values vs. frequency of pixel intensity values) that can be stretched to enhance the contrast in the image.

Preferably, the circular features in the near-field image are extracted using two techniques in which a Circle Hough Transform ("CHT") is used to extract the circular features and detect them. CHT is a specialization of the Hough Transform. The purpose of the technique is to find circles in imperfect image inputs. The Circular Hough Transform relies on generating an image (accumulation array) based on the input image, such that the value at each pixel corresponds to the likelihood that a distortion ring center exists at that specific pixel. The generated image is processed to find the reasonable locations of centers and estimate the corresponding radii. The process of building the accumulation array is sometimes referred to as voting. Thus, in FIG. 12, in a step S126 a 2D accumulation array (or accumulator matrix) is built. The accumulation array is thus basically an image with high values at pixels that are more likely to be the center of a distortion ring. The first step is to find the gradient field of the input image and use a threshold to find the pixels with gradient value above this threshold. At this point the accumulation array is initialized with zero values at every pixel. Then, for each vector in the gradient field, all the pixels in the same direction of this vector are determined and their values in the accumulation array are incremented. The range of pixels is determined by a fixed value related to the radius of the biggest ring radius expected. Pixels with high gradient value correspond to strong edges in the input image.

A different approach may be used for building the accumulation array. Instead of incrementing pixels in the range of each vector in the gradient field, a template may be used. The template would basically be an image containing vectors in a predefined and fixed way. To build the accumulation array, the center of the template is placed at a pixel (say X) in the gradient field. Then the dot product is obtained between all the vectors and pixels in the template and the corresponding vectors in the gradient field, the values are added, and the sums are stored as the value of the pixel X in the accumulation array. If a ring happened to be centered at pixel X with the same radius as the template, all the vectors will be exactly aligned and pixel X will have a very high value. A single template is preferably used for entire image. This approach gives the flexibility to create templates with different shapes or use real distortions from operating lasers.

In a step S128 the local maxima are found, and in step S130 the circle radii are estimated.

In another branch of the process, a multilevel accumulation array is built in a step S132. In a step S134 local maxima are found for each level.

In a step 136 the results of the two CHT analyses are combined.

For detection of slip planes, again the process flow occurs in two branches. In one branch a Standard Hough Transform ("SHT") is performed by first building an accumulation array in a step S138. Then local maxima are identified in a step S140. Then line segment ends are estimated in a step S142. In another branch, a radon transform is performed by first building a 2D Radon Transform array in a step S144. The Radon transform is the projection of the image intensity along a radial line oriented at a specific angle. Each column in the transform represents a projection with a different angle. The results are then used to smooth, filter, and find local maxima in a step S146. This information is used to estimate line segment ends in a step S148. The results of the two branches are combined in a step S150. Then preferably the results of step S136 and S150 are combined in a step S152 to create a processed near field image. The processed near field image will include the features in an extracted form in which they are more clearly visible and which can be detected automatically more easily.

In cases where multiple low level features exist, the Radon transform (or the standard Hough transform) may not yield robust detection results. In such cases, an alternative approach may be to use a bank of matched filters to detect lines at specific angles. Each filter may be a finite impulse response ("FIR") filter to process the image.

One advantage of the above process is that images can be retrieved and processed at selected intervals over a period of time. Over time it can be expected that the feature 510 indicating the existence of slip planes will grow as slip plane formation becomes more extensive or pronounced. This information can be used to determine when a maintenance event should be scheduled.

To obtain a quantified measure of the extent of slip plane degradation a binary counter array may be initialized to a preset value (e.g., zero) prior to the onset of slip planes. Signals from new slip planes may be added to the counter array as they appear in subsequent images. The counter array may be integrated on an image-by-image basis to form a one-dimensional, time-dependent, quantized slip plane signal.

Since each image also correlates to a measurable number of incident light pulses, this quantized slip plane signal can also be considered as a function of pulse count. This alternative signal provides information that allows one to assess cumulative pulse-related degradation. It also allows comparison of optical degradation of low use and high use light sources.

The binary nature of the counter array ensures that the contribution from slip planes that have previously been detected, but are temporarily undetectable because they are not illuminated, are not misidentified as "new" slip planes when they reappear. An additional benefit of this process is that it reduces noise in the quantized slip plane signal, which facilitates the use of this signal in efforts to determine when the optic ought to be replaced.

The counter size can be equal to the image size in pixels. This process leads to a quantized slip plane signal that increases with time until the optic with the excessive slip planes is replaced. Also, by adjusting the detection angle of the slip plane detection method, some types of laser misalignment can be detected.

The processed near field images can thus successfully differentiate slip planes from point defects and from diffraction off an aperture. The method can also be used to detect vertical line damage.

Thus a method for automatically detecting slip plane defects that may be conceived of as including the following steps: (1) parsing the file containing the binary source image data and converting it to a form suitable for analysis; (2) detecting the location of the near field (this location varies slightly from image to image, and from CASMM to CASMM); (3) extracting from the CASMM image the portion corresponding to the near field; (4) enhancing the near field image to make features more conducive to automated analysis by sequentially applying an unsharp filter, a bandpass filter, and a contrast spreading function; (5) perform a Hough Transform by building an accumulation array with high values at locations that are more likely to be along the edges of lines, and finding local maxima and estimate ends of lines segments; (6) using a Radon Transform to first build a radon transform array and smoothing, filtering, and finding local minima; (7) combining the results of the Hough Transform (step 5) and the Radon Transform (step 6); and (8) communicate the combined results to a database (via diagnostic values and/or configurable values, data logs, etc.).

A method for automatically detecting point-like defects may be conceived of as including the following steps: (1) parsing the file containing the binary source image data and converting it to a form suitable for analysis; (2) detecting the location of the near field (this location varies slightly from image to image, and from CASMM to CASMM); (3) extracting from the CASMM image the portion corresponding to the near field; (4) enhancing the near field image to make features more conducive to automated analysis by sequentially applying an unsharp filter, a bandpass filter, and a contrast spreading function; (5) using a first modified, circular Hough transform (CHT) to build an accumulation array with high values at locations that are more likely to be along the rings, and finding local maxima within each level; (6) using a second modified, circular Hough transform to build a multi-level accumulation array, and smoothing, filtering, and finding local minima; (7) combining the results of the first modified circular Hough transform (step 5) and a second modified Hough transform (step 6); and building an accumulation array with high values at locations that are more likely to be the center of an interference ring; (8) finding local maxima and estimating circle radii; and (9) communicating the results to a database (via diagnostic values, and/or configurable values, data logs, etc.).

A method for automatically detecting slip planes and point-like defects may be conceived of as including the following steps: (1) parsing the file containing the binary source image data and converting it to a form suitable for analysis; (2) detecting the location of the near field (this location varies slightly from image to image, and from CASMM to CASMM); (3) extracting from the CASMM image the portion corresponding to the near field; (4) enhancing the near field image to make features more conducive to automated analysis; (5) building an accumulation array with high values at locations that are more likely to be the center of an interference ring, or a line; (6) finding local maxima and estimating circle radii and line lengths; (7) finding local maxima and estimate ends of lines segments;

and (8) communicating the results to database (via diagnostic values and/or configurable values, data logs, etc.).

A method for retrieving and processing CASMM images for each laser light source having a CASMM may be conceived of as including the following steps: (1) identifying an identifier (e.g., a serial number (SN)) unique to the light source; (2) identifying an acquisition date for the light source; (3) retrieving the CASMM image file corresponding to the acquisition date from a memory source, e.g. from a file on a server; (4) parsing the file and extracting the near field image data; (5) processing the near field image data and detecting distortions (e.g., lines and circles); (6) summarizing the distortion information; (7) reporting the distortion information; and (8) repeating Steps 1-7 for each light source having a CASMM.

A method for retrieving and processing a sequence of CASMM images for a light source having a CASMM may be conceived of as including the following steps: (1) identifying a value (e.g., a serial number) unique to the specific light source; (2) identifying a first acquisition date for the light source; (3) identifying a final acquisition date for the light source; (4) retrieving a selection of CASMM image files from a memory source, e.g. from a file on a server, for a range of dates between and including the first acquisition date and the final acquisition date, and where each image has a timestamp; (5) for each image file taken in chronological order, parsing the file and extracting the near field image data; (6) processing the near field image data and detecting distortions (e.g., lines and circles); (7) integrating the distortion signal from the lines to form a quantified slip plane signal spanning the time of the first acquisition date to the timestamp of each image; (8) reporting the distortion information; and (9) repeating steps 1-8 for each light source having a CASMM. There may be a step after step (7) of extrapolating the distortion information to estimate a time to next failure ("fail-over time").

A method for retrieving and processing a sequence of CASMM images for a light source having a CASMM may be conceived of as including the following steps: (1) identifying a value unique to specific light source; (2) identifying a first acquisition date; (3) identifying a final acquisition date; (4) retrieving a selection of CASMM image files from a memory source, e.g. from a file on a server, for a range of dates between and including the first acquisition date and the final acquisition date, and where each image has a timestamp; (5) for each image file taken in chronological order, parsing the file and extracting the near field image data; (6) processing the near field image data and detecting distortions (e.g., lines and circles); (7) forming a quantified slip plane signal spanning the time of the first acquisition date to the timestamp of each image by compiling the maximal individual line distortions for each near field image; (8) reporting the distortion information; and (9) repeating steps 1-8 for each light source having a CASMM.

A method of creating a quantized slip plane signal may also be conceived of as including the following steps: (1) generating a sequence of fully processed CASMM images that have been processed to reveal lines oriented in a manner consistent with the orientation of slip planes (in binary form, i.e. where each pixel is either a 0 or a 1); (2) initializing a binary counter array to zero prior to the onset of slip planes; (3) adding to the binary counter array the signals from new slip planes as they appear; (4) integrating the counter array on an image-by-image basis to form a one-dimensional, time-dependent, quantized slip plane signal; (5) resetting the binary counter if substantially all of the slip plane indicators in the fully processed CASMM images vanish (and the light source remains in use).

A method of creating a quantized slip plane signal may also be conceived of as including the following steps: (1) generating a sequence of fully processed CASMM images that have been processed to reveal lines oriented in a manner consistent with the orientation of line damage (in binary form, i.e. where each pixel is either a 0 or a 1); (2) initializing a binary counter array to zero prior to the onset of slip planes; (3) adding to the binary counter array the signals from new slip planes as they appear; (4) integrating the counter array on an image-by-image basis to form a one-dimensional, time-dependent, quantized slip plane signal; and (5) resetting the binary counter if substantially all of the slip plane indicators in the fully processed CASMM images vanish (and the light source remains in use).

The above-described method of detecting slip planes is sensitive to noise in the form of randomly oriented short lines which are incorrectly interpreted as slip planes. It is preferable to differentiate these short lines from slip planes.

Also, the above methods are not specifically directed to detection of so-called worm-like features that are visible in some CASMM images. These features have been associated with coating damage on OPuS beamsplitters, which degrades optical performance. Having advance information that an OPuS beamsplitter has begun to fail is desirable so that its replacement can be planned to coincide with other maintenance so as to minimize unplanned downtime.

Also, in some methods many CASMM images must be processed every time one wants to create an optical image defect signal representative of the progression of a particular defect as a function of time. It is preferable to reduce the number of images that must be processed in each instance and so reduce the computational time required to create an updated optical image defect signal. This is accomplished by using already processed images and doing an incremental update. In effect, data is pre-processed up to a time T1, e.g. last week, and the results of this pre-processing are saved. Then when it is desired to update these pre-processed results with additional (e.g., the current week's) data, it is necessary to process only the additional data and then retrieve the previously processed results and append the processed additional data. This incremental updating is much faster than processing all of the data (both previous and additional) all over again.

Another issue with using a beam image analysis tool is that images must be accumulated over a period of time. Changes in beam direction must be taken into account to obtain a defect signal. Detection of defect signatures such as slip planes and/or worm-like features must be accumulated over a period of time to take into account the effect of changes in beam pointing from one image (day) to the next. Changes in beam direction result in non-uniform illumination that affects detection results. The change in beam pointing is caused by a number of factors including rep rate and duty cycle. The accumulation of detected features evens out the non-uniformity caused by changes in beam pointing. Accumulation results in a monotonically increasing function which is also helpful for estimating the magnitude of worm-like features in the CASMM image. There is, however, an image-to-image variable offset that makes correction for changes in beam direction unreliable.

It is important to calculate the integrated signal effectively as it plays a key role in determining whether we get a noisy signal or not. In the earlier method, each image that was studied was of different size due to the nature of images captured by the CASMM. Thus, to accumulate signals over a period of time, all images were subject to stretching or shrinking to match one another. This may result in erratic integrated signals. This issue can be resolved by ensuring that all CASMM images that are studied have the same size. To do this, the center pixel, pxlctr, is selected and an analysis region is defined by choosing an array whose x-coordinates range from [pxlctr−nx:pxlctr+nx] and y-coordinates range from [pxlctr−ny:pxlctr+ny]. To make the resulting array square, nx and ny are chosen to be the same value.

In other word, the black and white images resulting from application of the defect detection methods disclosed herein are used to quantify the extent of damage to an optical element under consideration. As an example, the number of pixels that are white in color (with a white pixel denoting the presence of a defect signature) may be used to estimate of the extent of damage. In other words, a light source having more optical damage will yield a CASMM image having a higher number of white pixels as compared to a CASMM image obtained from a light source having less optical damage.

In general it is desirable to analyze multiple CASMM images. Analyzing a single CASMM image will not in general suffice as it is necessary to account for the effects of beam bouncing. Thus, once a defect has been detected, a series of images is preferably analyzed. This can be accomplished by accumulating the respective defect signatures from each of the images in the series. Accumulation of defect signatures from several CASMM images in this manner requires the size of the CASMM images to be the same in the sense that the number of rows and columns must be the same. Near field images extracted from the CASMM, however, do not necessarily always have the same size due to variations in illumination.

One way of making the CASMM images all the same size involves using a magnification value to stretch or shrink the image. This method, however, has the disadvantage that it also stretches or shrinks the defect signatures thus resulting in erroneous estimates of the accumulated defect signal. In general this method yields inflated values for the defect signal.

Another way of making the CASMM images all the same size involves finding the centroid of the image and taking a preset number of columns to the left and right of the centroid and a preset number of rows above and below the centroid for all the CASMM images. Note that the preset value can be changed from light source to light source if required. This method ensures that all the images will be of the same size without shrinking or stretching the images and their included defect signatures. A CASMM image that is too small in the sense that it lacks enough rows and columns may be discarded as a corrupted CASMM image. This method enables a more reliable quantification of the extent of optical damage in a light source.

In some arrangements described above, defect progression is determined as a function of elapsed time or operating time. There may be circumstances, however, in which it is desirable to determine defect progression as a function of other parameters such as frame pulse count, module pulse count, and so forth.

Also, one technique for creating an updated optical image defect signal representative of the progression of a particular defect involves adding new image data when it becomes available and analyzing the entire data set including images which have already been analyzed at least once. This process may be very time consuming.

It is possible to analyze sets of beam images and generate a defect signal separately for each type of optical defect for which a detection method exists. Updating all of the sets is additionally time consuming.

There is thus a need for a way to detect and identify low-level features, and for attributing these features to specific defect types. A further need exists for ways of monitoring and efficiently updating the evolution of these features that allows prediction how much time remains before light source optical performance degrades sufficiently that an optic or module must be replaced.

Figure 13:
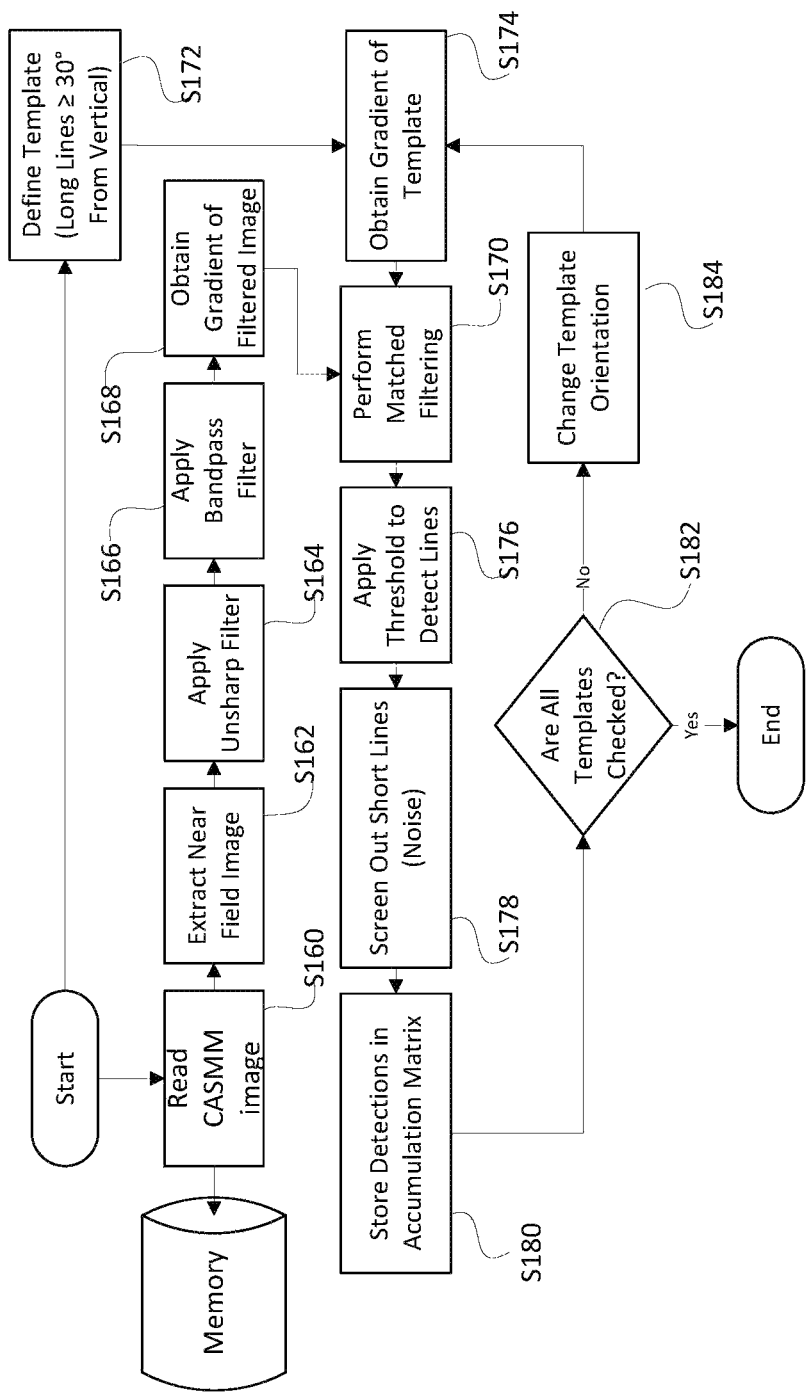
FIG. 13 is a flow chart depicting a method of extracting features present in a CASMM image possibly indicative of slip plane defects according to another aspect of the disclosed subject matter.

FIG. 13 shows another slip plane detection algorithm that is particularly insensitive to noise such as, for example, noise arising from the presence of short lines. A typical CASMM image has a small, bright spot that is the far field image and a rectangular field that is the near field image. The CASMM image is read in a step S160 similar to step S120 in FIG. 12. In a step S162 to extract the near field of the CASMM image, the entire image is converted into binary form. This conversion is carried out by comparing each pixel to a threshold intensity value. All pixels having intensity above this threshold value are assigned a numerical value of 1 (white) and others are made 0 (black). Each set of contiguous white pixels is labelled. The set with the maximum number of white pixels defines the extent of near field. Extracting the position of these pixels gives the near field image. This approach aids in detection of the near field component in low quality CASMM images. In a step S164 an unsharp filter is applied as described above in connection with step S124 of FIG. 12. In a step S166 a bandpass filter is applied also as described above in connection with step S124 of FIG. 12. In a step S168 a gradient is obtained of the filtered image.

In a step S170 matched filtering of the gradient of the filtered image is carried out against a gradient of a template. The template is defined in a step S172 and a gradient of the template as defined is obtained in a step S174. As noted, the template may be, for example, a series of lines greater than a predetermined length and at an angle of 30 degrees or greater from vertical.

The matched filtering applied in step S170 is used in signal processing to improve the signal to noise ratio (SNR). It is a process in which a template is correlated with an unknown signal. The template is a known signal that one expects in the observed signal, i.e. embedded in the CASMM image and not readily observed. This permits detection of the presence of template-resembling portions of the CASMM image. In other words, the template may be a generic template of an expected signal. It is correlated with an observed signal to improve SNR. Occurrence of a peak in the matched filtered signal indicates that the template is present in the signal. The position of the peak indicates the location of the template in the signal.

Thus, in the presently described embodiment, slip plane detection is executed by matching filtered CASMM images with templates. This process yields an image showing the correlation of each pixel in the CASMM image with the template. If a slip plane feature exists in the image, the value of correlation at the corresponding location will be high. In step S176 a threshold value for the correlation is applied. A threshold value that produces clear results can be determined empirically.

Noise is classified as lines shorter than a particular line length threshold value. This threshold value can be determined by studying slip-planes and their lengths. For example, to define a line to qualify as slip-plane, review of slip plane lengths from many different CASMM images suggests a requirement that the line in the image be more than ten contiguous pixels in length. Thus, in the detection process, lines shorter than 10 pixels length may be screened out. This screening process occurs in a step S178. The results are stored in an accumulation matrix in a step S180. In a step S182 the method determines whether all templates have been checked. If not, then the template orientation is changed in step S184 and this new template orientation is then used for matched filtering. The process of FIG. 13 ends when all templates have been checked.

Figure 14:
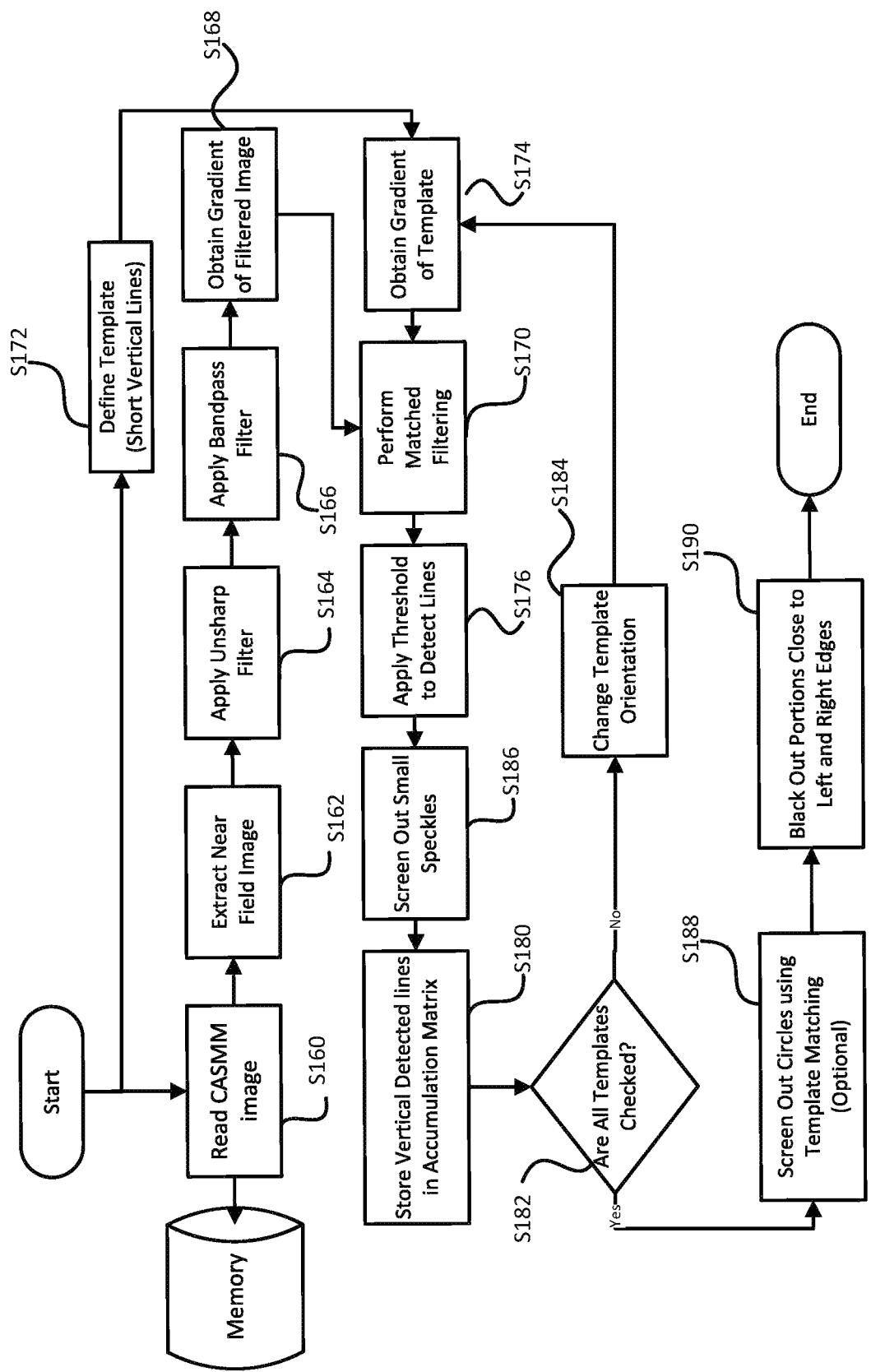
FIG. 14 is a flow chart depicting a method of extracting worm-like features possibly present in a CASMM image possibly indicative of defects according to another aspect of the disclosed subject matter.

FIG. 14 shows a method of detecting worm-like features. As mentioned, worm-like features appear in CASMM images and are believed due to defects in upstream optical components such as defective OPuS beam splitters. Matched filtering is performed as described above in connection with FIG. 13.

The matched filtering process produces an output whose values are normalized based on the highest numerical value and also the lowest numerical value in the result. This normalization process will lead to each pixel having values ranging between and including 0 and 1. In the gray-scale color map, 0 is represented as black and 1 is represented as white. Values between 0 and 1 are mapped to an intermediate gray-scale color having values between 0 and 1. For graphical representation purposes, these intensity values are mapped to a color map. A convenient color map is gray-scale. Thus, if the intensity value is 0, then the pixel is represented as black. If the intensity value is 1, then the pixel is represented as white. Values between 0 and 1 are mapped to an intermediate gray-scale color.

Due to the presence of noise it is preferred to carry out the detection of worm-like features using a variable threshold. Initially, in order to confirm the presence of worm-like features, the initial threshold value is kept high. Once the detection of wormlike features exceeds this value, the presence of worm-like features is deemed confirmed and imprints of worm-like feature is added to the accumulation array. After the first detection and recording of worm-like features, the threshold value is reduced. This permits accommodation of effect due to the bouncing of beam, i.e., the beam might not exhibit worm-like features because the beam is not sufficiently illuminating the part of the optic having the defects giving rise to worm-like features. Once the wormlike features disappear (after a maintenance event), the detection algorithm will not detect any wormlike features and the value returned by the algorithm will be much smaller than the lower threshold value being used. A complete black image will be recorded in the accumulation array. Once this happens, the threshold value reverts to the initially used higher value.

In FIG. 14, in a step S172 the vertical line template for wormlike feature detection is rotated by about 10 degrees to either side of the vertical to capture the entire feature. In a step S176 it is assumed pixels with an intensity value of more than 0.8 indicate presence of worm-like features. In a step S186 small speckles are screened out as noise. The process of FIG. 14 also includes an optional step S188 of screening out circles using template matching. This is necessary in some cases to have error free detection. More often than not it is not required as circles are rare. The process of FIG. 14 also includes a step S190 of blacking out portions close to the left and right edges of the image. This step is performed to make sure diffraction fringes that may be present are not interpreted as worm-like features.

Figure 15:
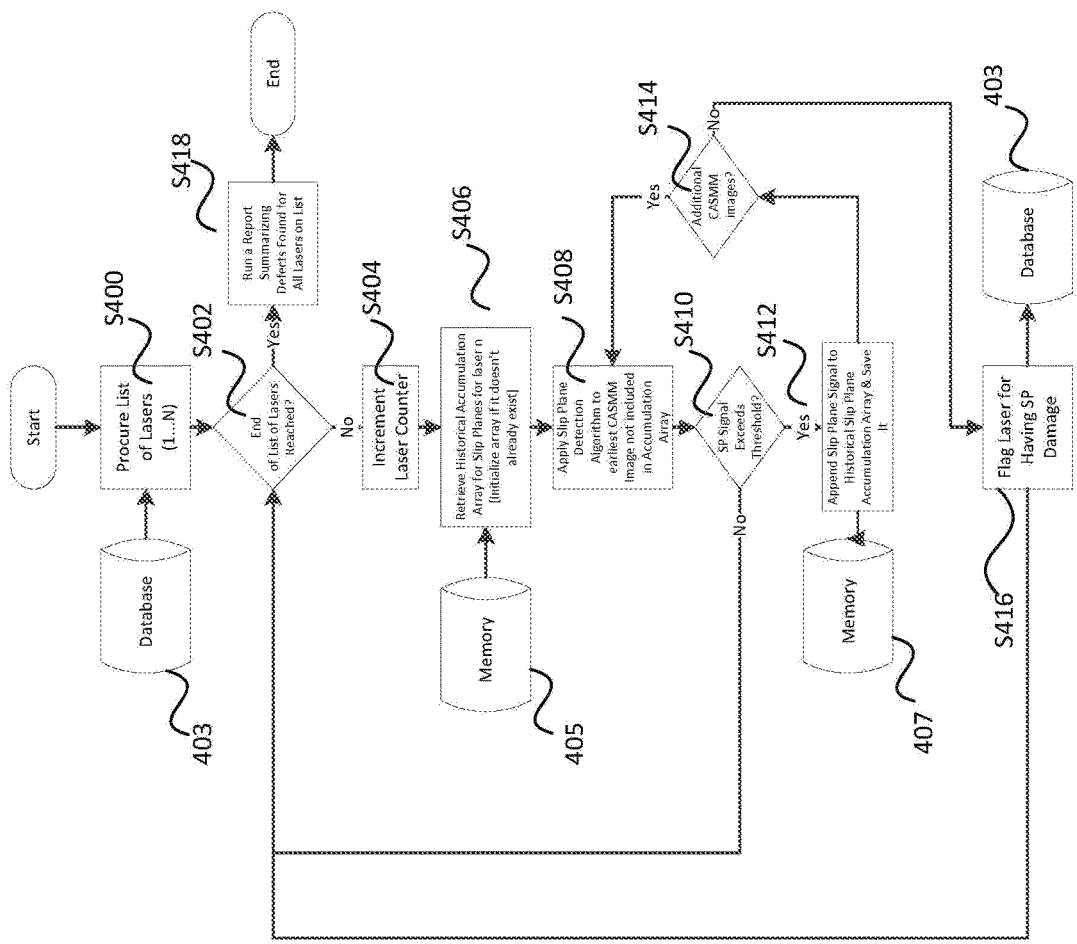
FIG. 15 is a flow chart depicting a method of monitoring light source optics for slip plane damage according to another aspect of the disclosed subject matter.

FIG. 15 shows an example of a method of monitoring light source optics for slip plane damage using the above slip plane detection method. A list of lasers is procured in a step S400 from a database 403, and a laser counter is defined to uniquely associate a numeric sequence to each laser in the list of lasers. In a step S402 it is determined whether all of the lasers on the list have been processed. If not, then in a step S404 the laser counter is incremented to process the next laser. In a step S406 an historical accumulation array for that laser is retrieved from a memory 405. If an historical accumulation array does not exist, then an accumulation array is initialized. In a step S408 the slip plane detection method is applied to the earliest image not included in the accumulation array. A step S410 determines whether the detection method indicates an excessive number of slip plane defects. If the determination in step S410 is affirmative the slip plane signal is appended to the historical slip plane accumulation array in a step S412 in a memory 407 which may or may not be separate from memory 405. If the determination in step S410 is negative then the process reverts to step S402. In step S414 it is determined whether there are additional images to be processed. If this determination is affirmative then the process reverts to a step S408. If this determination is negative, then in a step S416 the laser is flagged as one having at least one, and possibly more than one, optical element with slip plane damage and an indication of the laser flagged is stored in database 403. The process continues until all lasers on the list have been studied. In a step S418 a report is generated summarizing the defects found for all lasers on the list.

The process of the method shown in FIG. 15 is intended to analyze one defect type at a time. The specific example of a defect referenced in FIG. 15 is slip planes although it will be apparent that the process of FIG. 15 could be adapted to address another type of defect, for example, worm-like features.

Figure 16:
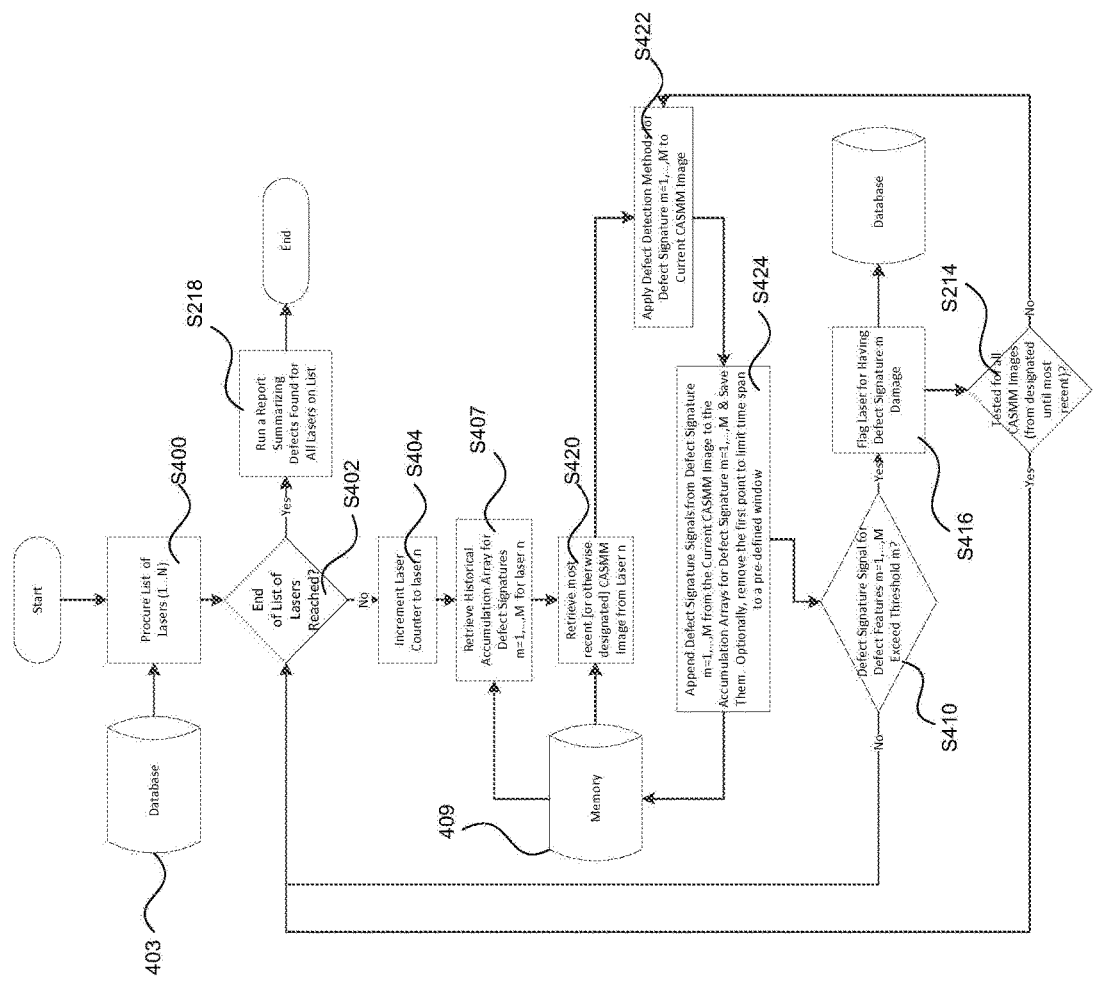
FIG. 16 is a flow chart depicting a method of appending defect signatures to an accumulation array without storing defect signatures individually according to another aspect of the disclosed subject matter.

FIG. 16 shows a process of appending CASMM defect signatures to an accumulation array, without storing defect signatures individually. The process of FIG. 16 deals with multiple defect types that could include slip planes, worm-like features, interference fringes due to aperture clipping, interference fringes due to line damage, etc. The process of FIG. 16 is extendible to as many types of features as are desired to analyze and store.

In FIG. 16 steps carried out essentially the same as those in FIG. 15 are given like designations. In FIG. 16, step S420, an image is retrieved from the current laser from a database 403. This image may be the most recent image from a laser or another image. In step S407 a historical accumulation array for each member of an ensemble of M types of defect signatures is retrieved from a memory 409. In a step S422 the defect detection method is carried out to ascertain whether a defect signature is present in the image for each member of an ensemble of M types of defect signatures. In a step S424, the defect signature signals from the current image are appended to the accumulation array. Optionally, data may be removed from the array to limit the time span under consideration to a predefined window defined in terms of time and/or number of pulses, for example, 10 weeks, 20 weeks, etc. In a step S410 it is determined whether the defect signature signal for each member of an ensemble of M types of defect signatures exceeds a respective threshold value. If it is desired to monitor light source optics for multiple damage mechanisms then step S416 can be replaced or supplemented with a step of generating and storing a report if desired that also includes a step of setting flags in the database to indicate which defects were found.

In one possible embodiment the accumulation array may be implemented and a binary accumulation array for each defect type with each array address (pixel) storing either a 0 or a 1. If greater granularity is desired in differentiating between levels of intensity then the accumulation array can be configured so that each array address stores more than one bit, that is, so that each address has pixel depth, i.e. for example, 8 bits, 16 bits, etc. In this approach, for example, an 8 bit pixel could be used to assign a grey scale level as set forth above. In addition, a multiple bit pixel could be used to encode binary data about more than one type of feature. For example, an 8 bit pixel could also be used to store binary data for eight different types of features with, for example, bit 0 being used for indicating slip plane damage, bit 1 being used for worm-like features, and so on. Also, a multiword pixel could also be used. For example, a 32 bit pixel can be viewed as a 4×8 bit that is used as just described. For example, an 8 bit pixel could also be used to store eight bits of data for four different types of features with, for example, bits 0-7 being used for indicating a level of slip plane damage, bits 8-15 being used for indicating a level of presence of worm-like features, and so on. It will also be apparent that the memory space can be configured to store a combination of binary (one-bit) representation for some feature or features and word (multiple bit) representations for another feature or other features.

Figure 17:
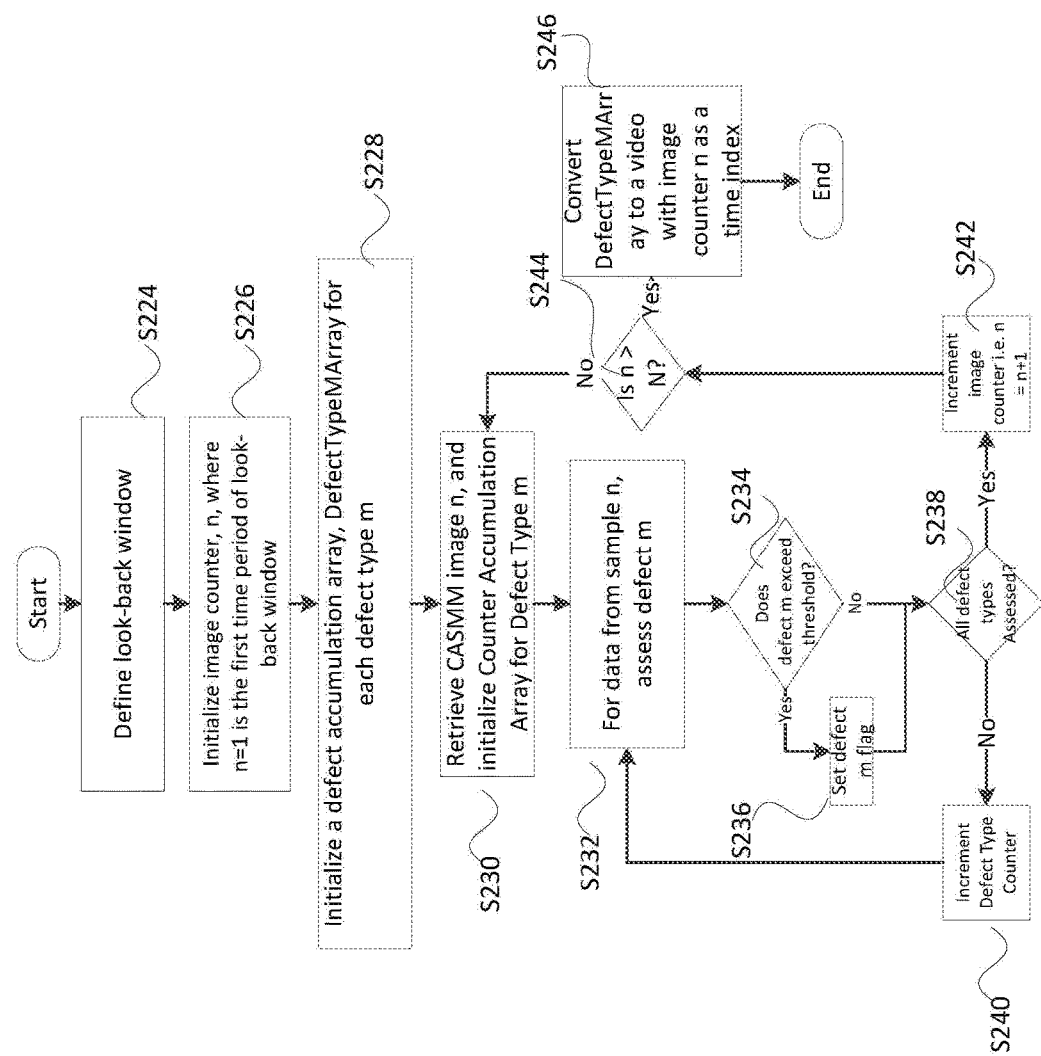
FIG. 17 is a flow chart depicting a method of forming image defect tracking arrays in which a video image is generated according to another aspect of the disclosed subject matter.

FIG. 17 shows a method of forming image defect tracking arrays in which a video image is generated. A look-back window is defined in a step S224. In a step S226 an image counter is initialized where n=1 corresponds to the first interval (e.g. day) of the look-back window and where n=1, 2, . . . , N with N being the number of CASMM images to be sampled in the look-back window. In a step S228, a defect accumulation array DefectTypeMArray is initialized for each type of defect m under consideration, m=1, 2, . . . , M, where M is the total number of detectable defect types, and where each array is Nx×Ny×N, and where Nx and Ny are the number of pixels in the x- and y-directions of the near field of a CASMM image. In a step S230, an image n is retrieved, and a respective counter and accumulation array for each of the defect types is initialized. In a step S232, data from sample n is assessed for the presence of the defect under consideration and all bits in plane n of DefectTypeMArray are set to 1 for all pixels for which defect m exceeds threshold. In a step S234, this method determines whether the number of pixels in the data for sample n exceeds a predetermined threshold for the particular defect under consideration. If the determination in step S234 is affirmative, then a flag is set in a step S236 indicating the presence of that defect in the image corresponding to that data. Then, or if the determination in step S234 is negative, it is determined in a step S238 whether all types of defects have been assessed. If the determination in step S238 is negative, then the defect type counter is incremented in a step S240, and the process reverts to step S232. If the determination in step S238 is affirmative, then the image counter is incremented in a step S242. In a step S244 this method determines whether all images have been analyzed. If the determination in step S244 is negative, then the process reverts to step S230. If the determination in step S244 is affirmative, then if the defect type array is converted to a video with the image counter n as a time index in a step S246. If desired, the time index can be replaced with a pulse count index. Note that the accumulation matrix is three dimensional with each image corresponding to a specific two dimensional array in the three dimensional accumulation matrix.

Figure 18:
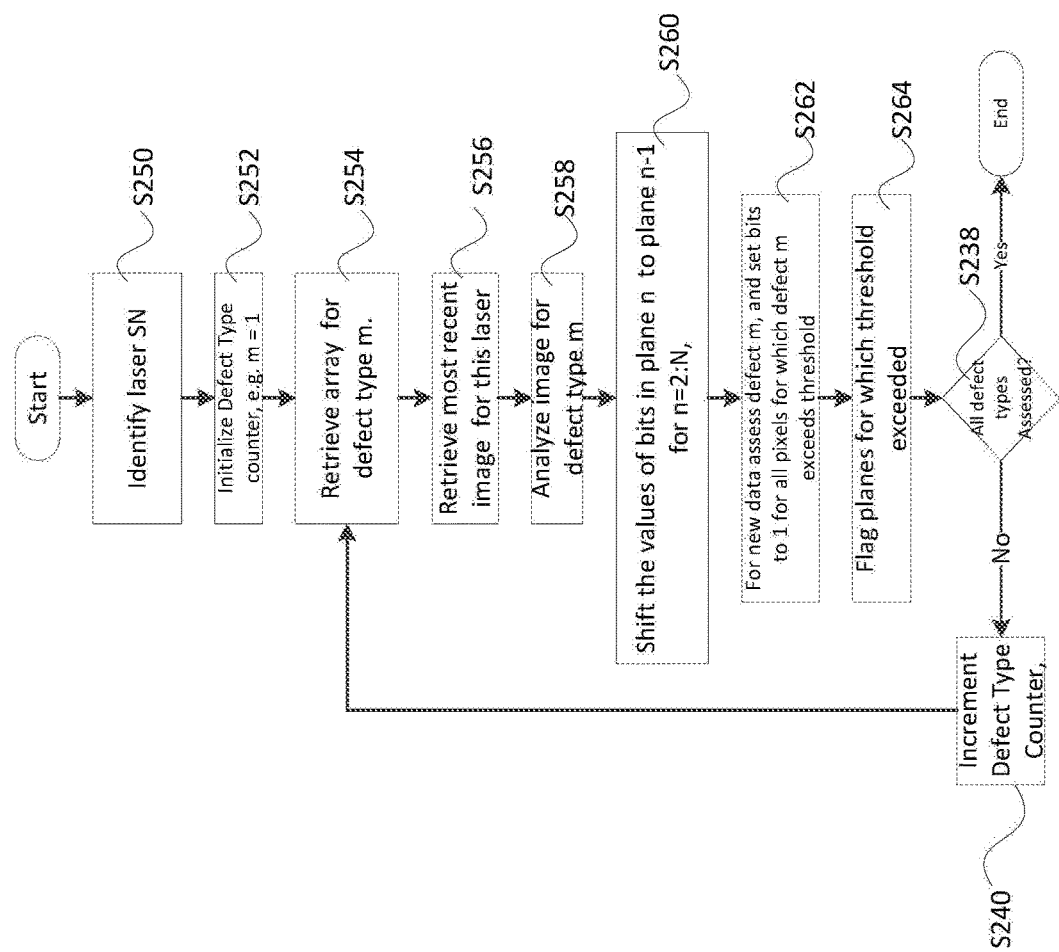
FIG. 18 is a flow chart depicting a method of updating an image defect tracking array using bit-shifting according to another aspect of the disclosed subject matter.

FIG. 18 shows a method of updating an image defect tracking array using bit-shifting. A laser SN is identified for which one wishes to update a CASMM image defect tracking array in a step S250. A defect type counter is initialized in a step S252. In a step S254, a defect type array Defect-TypeMArray for defect type m is retrieved. The size of this array is Nx×Ny×N. The most recent CASMM image ('New') for the laser is retrieved in a step S256. In a step 258, the CASMM image is analyzed for the specific type m of defect under consideration. In a step S260, for all Nx×Ny×N bits, the values of bits in plane n of DefectType-MArray are shifted to plane n−1 for n=2:N, which eliminates the bits in plane 1, and makes room for the New sample in plane N. As DefectTypeMArray is a 3D matrix there is no carry over of results. In a step S262, for the new data, the image is assessed for the presence of defect m and the bits in the plane are set to one for all pixels in which the defect type signal exceeds a predetermined threshold. In other words, for data from 'new N', assess defect m, and set bits in plane N of DefectTypeMArray to 1 for all pixels for which defect m exceeds threshold. In a step S264, all planes for which the threshold has been exceeded are flagged. The remaining steps of the method depicted in FIG. 18 are the same as those described above for steps having the same reference numerals.

Figure 19:
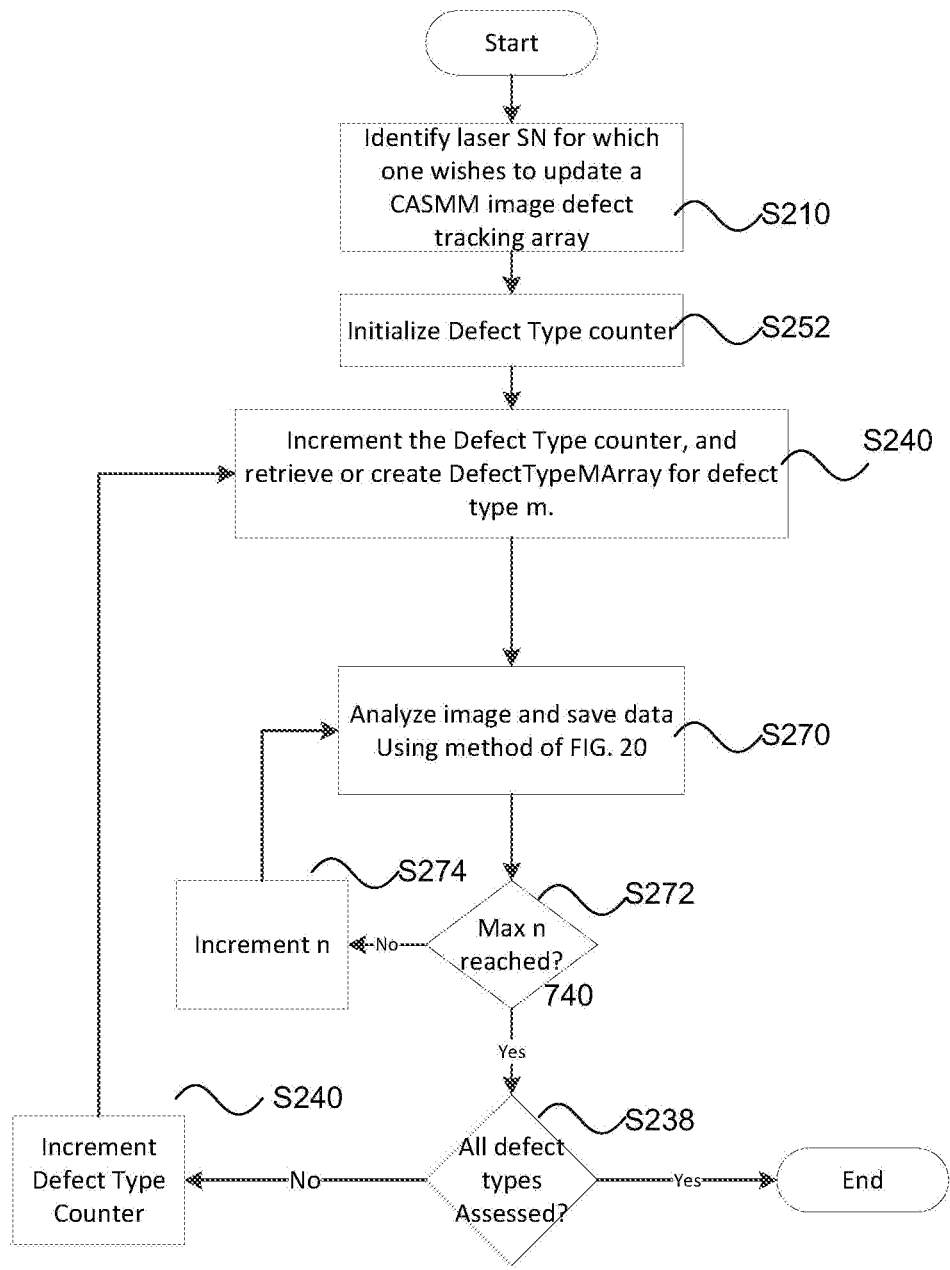
FIG. 19 is a flow chart depicting a method of updating an image defect tracking array using wraparound indexing according to another aspect of the disclosed subject matter.

FIG. 19 shows a method of updating an image defect tracking array using a wraparound indexing method described below. The steps of the method depicted in FIG. 19 are the same as those described above for steps having the same reference numerals. In addition, in a step S270, image data is analyzed and saved in accordance with the method described below. In a step S272 it is determined whether the maximum n has been reached, that is, that all images have been analyzed and data for those images saved. If the determination in step S272 is negative then n is increased by one and the process reverts to step S270. If the determination in step S272 is affirmative and then a determination is made as to whether all defect types of been assessed as outlined above.

Figure 20:
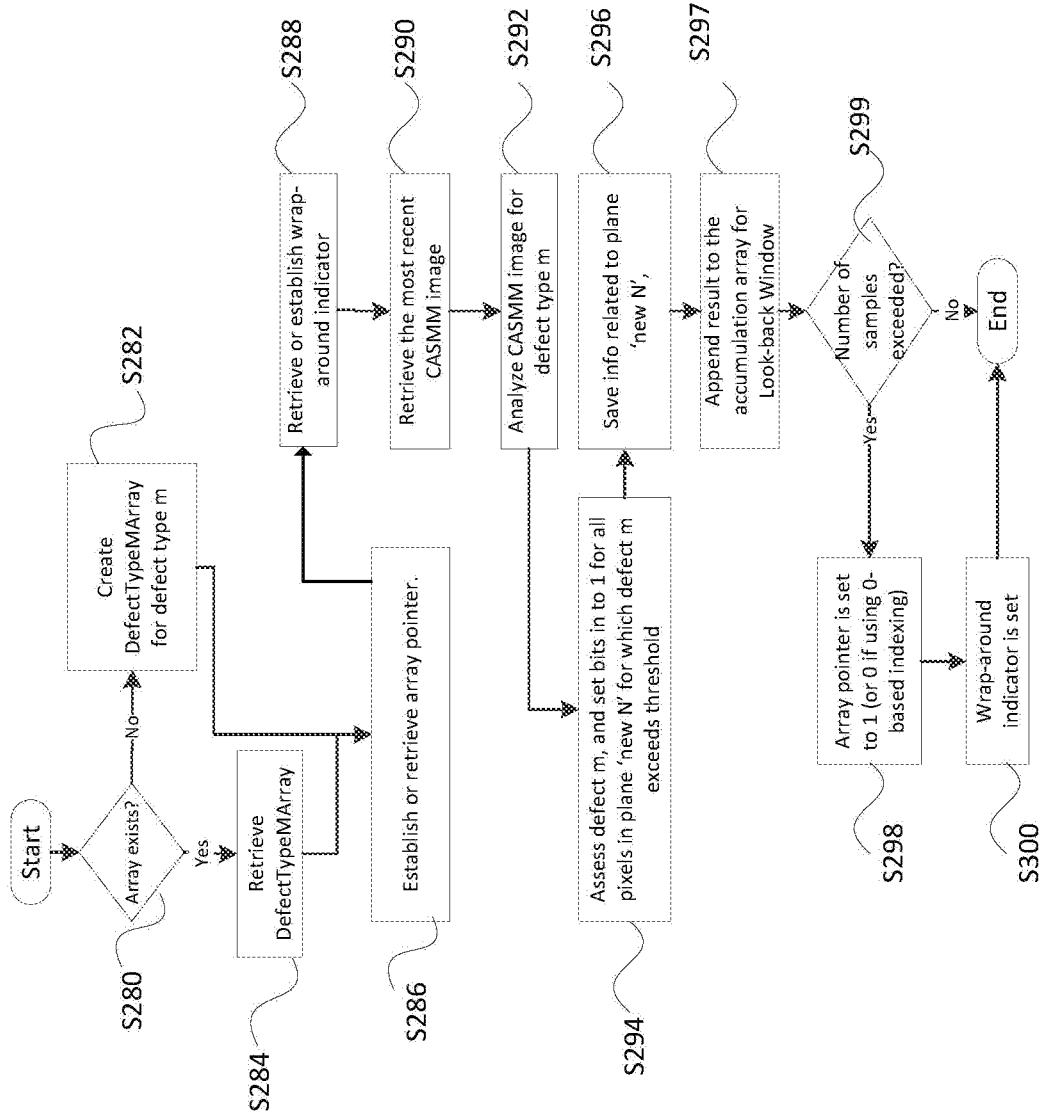
FIG. 20 is a flow chart depicting a method of detecting defects according to another aspect of the disclosed subject matter.

One method for implementing step S270 as described above is shown in FIG. 20. As shown, a step S280 determines whether a defect type array exists for the specific type of defect under consideration. If the determination is negative then the array is created in a step S282. If the determination in step 280 is affirmative, then a step S284 retrieves the defect type array. In a step 286, a pointer is established or retrieved. The array pointer designates which planes in DefectTypeMArray have been filled up, i.e. the next available plane. As described below in connection with FIG. 21, the array pointer designates which planes in the array have been filled up. In other words, the array pointer designates the next available plane. In a step S288, a wraparound indicator is retrieved or established. The most recent image for the laser under consideration is retrieved in a step S290. This image is analyzed for the defect type under consideration in a step S292. A step S294, for data from 'new N', assesses defect m, and set bits in plane 'new N' (indicated by the array pointer) of DefectTypeMArray to 1 for all pixels in plane 'new N' for which defect m exceeds threshold. In a step S296, information related to the plane is saved. This information can include the identification information for the laser, the dates the image was captured, the array pointer, the wraparound indicator, frame pulse count, and so forth. In a step S297, the results of the save operation of step S296 are appended to the accumulation array. In the example described, the size of the accumulation array is determined by the size of the look back window as described above. A step S299 determines whether the array pointer indicates a plane identification that is greater than the number of look back window samples. If the determination in step S299 is affirmative, then in a step S298 the array pointer is set to one (or zero if using zero base indexing) so that the data in plane one is overwritten and then the process ends. A wraparound indicator is then set in a step S300. If the determination in step S299 is negative, then the process ends.

Figure 21:
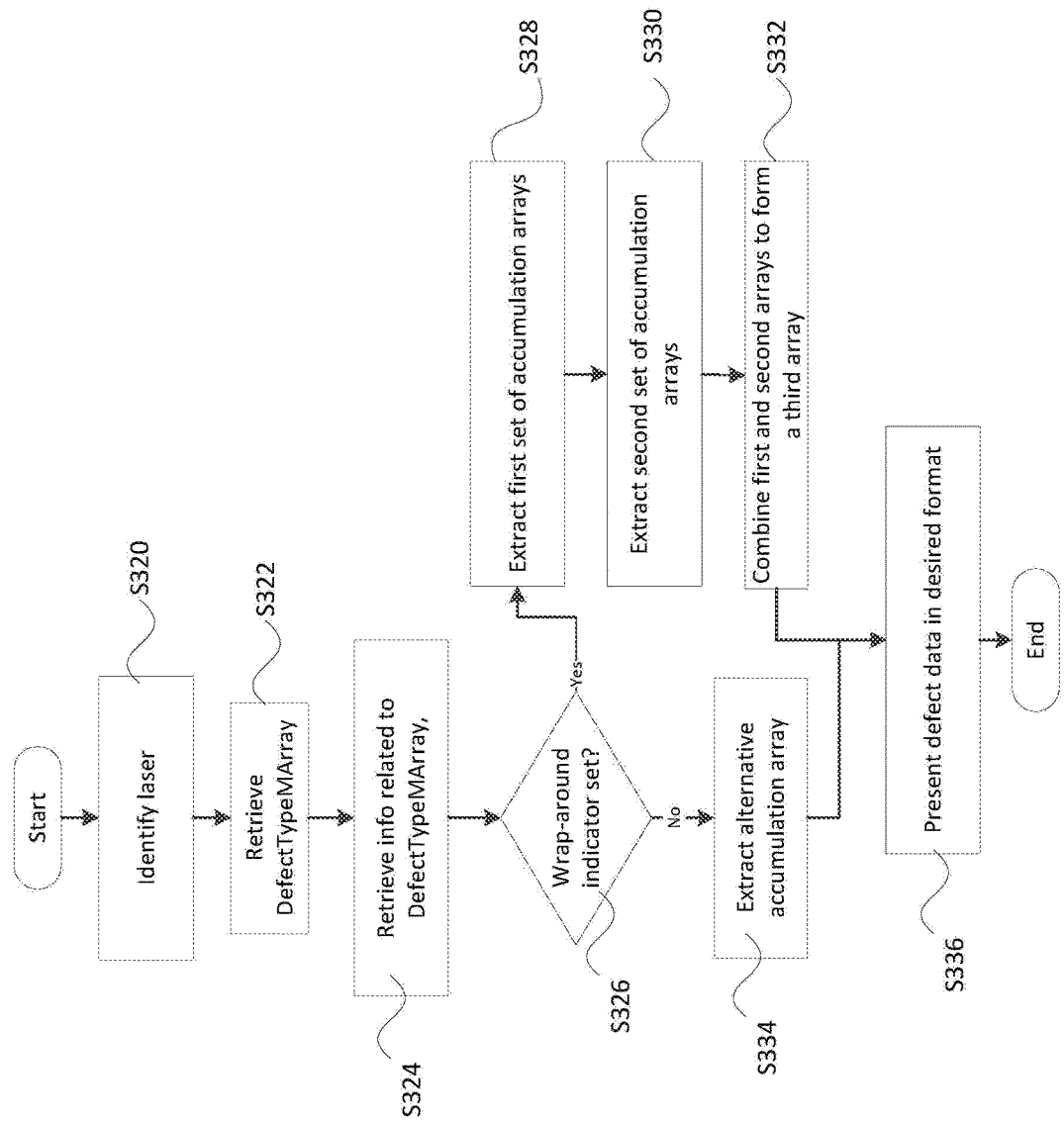
FIG. 21 is a flow chart depicting a method of viewing a beam image defect tracking array created using wraparound indexing according to another aspect of the disclosed subject matter.

FIG. 21 shows a method according to another embodiment of the invention of viewing a CASMM image defect tracking array that was created using wraparound indexing. The laser for which one wishes to view a CASMM image defect tracking array is identified in a step S320. In a step S322 the defect type array is retrieved for that laser. In a step S324 information related to the defect type array is retrieved as well. In other words, information is retrieved related to DefectTypeMArray, e.g. laser SN, CASMM image date, array pointer, wrap-around indicator, etc. A step S326 determines whether a wraparound indicator has been set. If the determination in step S326 is affirmative, then a set of accumulation arrays is extracted plane by plane in a step S328 from the plane indicated by the array pointer plus 1 to the end of the array. This creates a first set of planes. In a step S330 accumulation arrays are extracted plane by plane from plane one to the plane indicated by the array pointer. This creates a second set of planes. In a step S332 the first set of planes and the second set of planes is combined to form a third set of planes that is a sequential in time or the order the samples were taken. If the determination in step S326 is negative then in a step S334 an alternative accumulation array is extracted plane-by-plane from one to the plane indicated by the array pointer. After step S334 or step S332, a step S336 is carried out in which defect data is presented in the desired format, e.g. a movie, line-plot, comparison to a laser parameter, e.g. polarization, pointing, divergence, module pulse count, etc. The process then ends.

Figure 22:
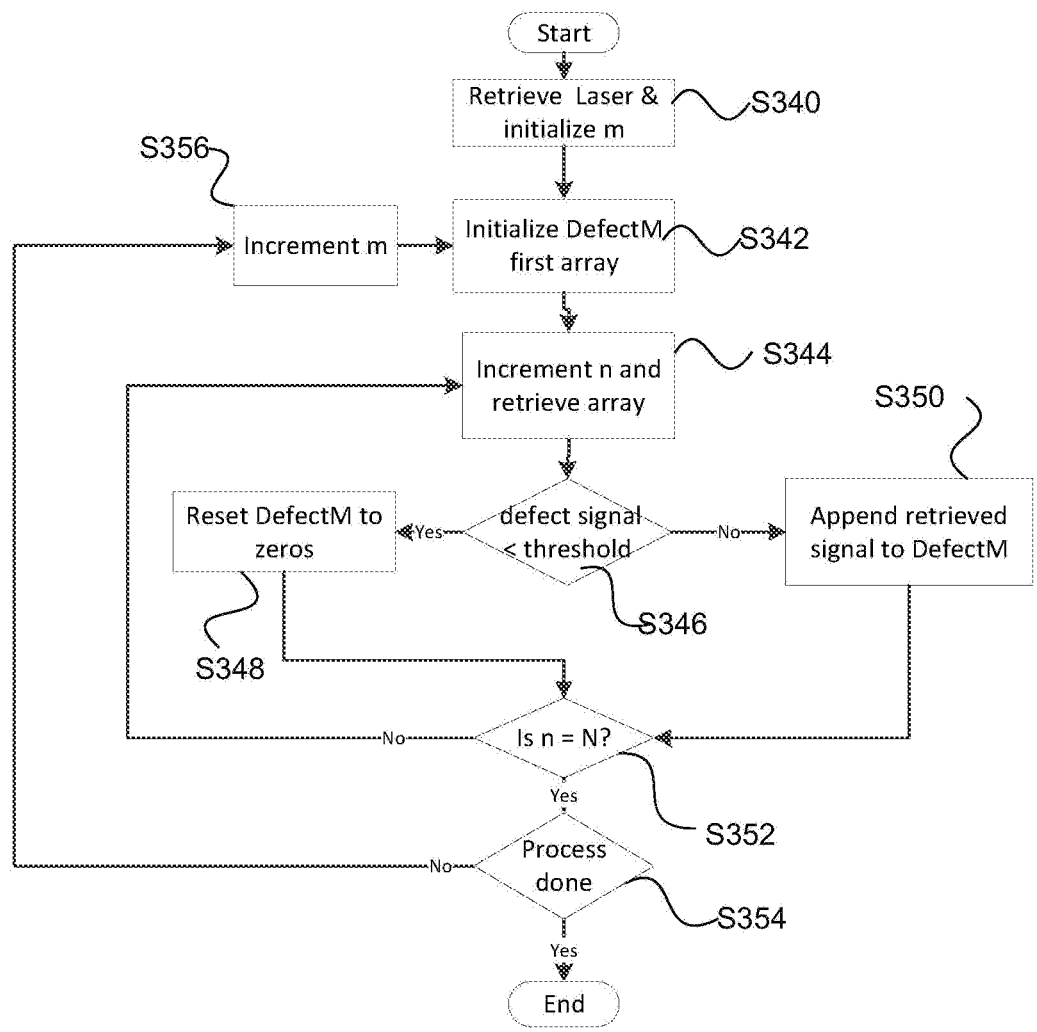
FIG. 22 is a flow chart depicting a method according to another embodiment of the invention of appending signals from the accumulation array.

FIG. 22 shows a method according to another embodiment of the invention of appending signals from the accumulation array. In a step S340 the accumulation array is retrieved for a given laser and the defect index m of the defect under consideration is initialized. In a step S342 the accumulated defect signal DefectM is initialized with a first array of the accumulation array for the given type of defect under consideration. In a step S344 the laser index n is incremented and the array for that laser is retrieved from the accumulation array. A step S346 determines whether the magnitude of the defect signal is less than a predetermined threshold. If the determination in step S346 is affirmative and then the accumulated defect signal is reset to zeros in a step S348. If the determination in step S346 is negative then the retrieved signal is appended to the accumulated defect signal in a step S350. In either case, a determination is made in a step S352 whether the index for the laser is equal to the size of the accumulation array. If the determination in step S352 is negative then the process reverts to step S344. If the determination in step S352 is affirmative, then a determination is made in a step S354 about whether the process has been completed for all defect types of interest m=1, ..., M. If the determination in step S354 is negative then in step S356 the defect type index m is incremented and the process reverts to step S342. If the determination step S354 is affirmative then the process ends.

Figures 23, 24:
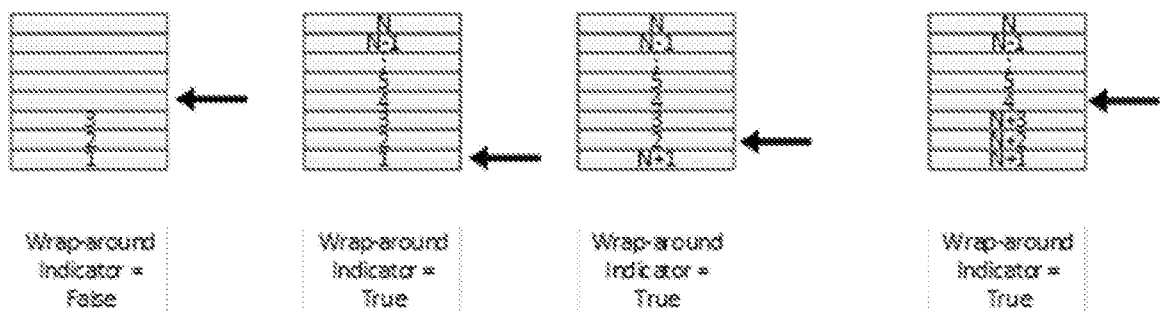
FIG. 23 is a diagram showing some possible conditions of an accumulation array according to an aspect of an embodiment.
FIG. 24 is a diagram showing the use of a time stamp as an index according to an aspect of an embodiment.

As stated above, in the process described in connection with FIG. 21, a determination is made in step S326 about whether a wraparound indicator has been set. The wraparound indicator is simply an indication of whether the available N planes of data corresponding to the look-back window have been filled up. FIG. 23 shows four conditions for a linear array of size N.

In the leftmost array new data is being added to an unoccupied position (plane) in the array. This form of additive indexing is not wraparound indexing so the wraparound indicator would not be set to true. Instead, the stored wraparound indicator would have a value of false indicating that wraparound indexing is not being used. Determining whether the wraparound indicator has been set is determining whether the indicator has been set to true. In the other examples in the diagram new data is being added to an occupied position in the array. This is wraparound indexing so the wraparound indicator is set to true.

As indicated, values other than a simple sequential indicator can be used as an index n. For example, the time stamp can be used as an index as shown in FIG. 24

Figures 25, 26:
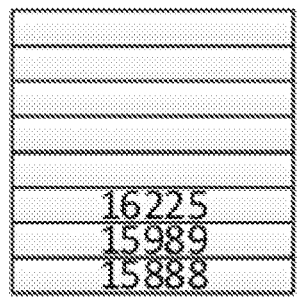
FIG. 25 is a diagram showing the use of a frame pulse count as an index according to an aspect of an embodiment.
FIG. 26 is a diagram showing an array entry according to an aspect of an embodiment.

Alternatively, a frame pulse count could be used as an index as shown in FIG. 25

Some combination of these values could also be used as an index. The index can also be used to track additional relevant information. For example, if a time stamp is used as an index, then the laser number, frame pulse count, and other information can be associated with that time stamp, as shown in FIG. 26.

As described, one aspect of this invention is a method capable of reducing noise when detecting the signature of slip planes in light source near field images. Another aspect is a method capable of detecting worm-like features from near field images in optics in a light source. Another aspect is a method capable of detecting the signature of multiple degradation mechanisms in light source near field images. Another aspect is making the defect signature more reliable to help in comparing the signal to laser performance, giving methods to quantify laser damage based on defect signals. Another aspect is a method of saving defect signatures in arrays, which is computationally more efficient than creating a video each time.

The above description is predominantly in terms of analysis of near field images for a beam analysis tool such as a CASMM for the purposes of an example only. It will be apparent to one of ordinary skill in the art that the above methods can also be applied for finding features in the beam image taken at locations along the beam path other than the locations used to obtain near field images.

Some examples of what performing an adjustment could mean include realigning and/or repositioning a lens, mirror, prism, or other optic; modifying a timing of events or measurements; modifying a schedule of maintenance events; among others; or combinations thereof.

The above description includes examples of multiple embodiments. It is, of course, not possible to describe every conceivable combination of components or methodologies for purposes of describing the aforementioned embodiments, but one of ordinary skill in the art may recognize that many further combinations and permutations of various embodiments are possible. Accordingly, the described embodiments are intended to embrace all such alterations, modifications and variations that fall within the spirit and scope of the appended claims. Furthermore, to the extent that the term "includes" is used in either the detailed description or the claims, such term is intended to be inclusive in a manner similar to the term "comprising" as "comprising" is construed when employed as a transitional word in a claim. Furthermore, although elements of the described aspects and/or embodiments may be described or claimed in the singular, the plural is contemplated unless limitation to the singular is explicitly stated. Additionally, all or a portion of any aspect and/or embodiment may be utilized with all or a portion of any other aspect and/or embodiment, unless stated otherwise.

The invention claimed is:

1. A method for automatically detecting a state of a light source for semiconductor photolithography, the method comprising the steps of:
   (a) obtaining at least a portion of an image of a light beam produced by the light source;
   (b) obtaining image data from the portion;
   (c) filtering the image data using template matching to detect a state of the light source;
   (d) storing the results of the filtering operation in a database, wherein steps (a) through (c) are performed repeatedly over a period of time to detect the state repeatedly;
   (e) determining an evolution of the state over time from the plurality of stored results of the filtering step; and
   (f) adjusting the light source after a period of time having a duration based at least in part on the evolution of the state over time.

2. A method as claimed in claim 1 wherein the state is an extent of existence of one or more features in the image.

3. A method as claimed in claim 2 wherein one of the one or more features in the image is a worm-like feature.

4. A method for automatically detecting a state of a light source for semiconductor photolithography, the method comprising the steps of:
   (a) obtaining at least a portion of an image of a light beam produced by the light source;
   (b) obtaining image data from the portion;
   (c) filtering the image data using template matching to detect a state of the light source, the state being an extent of existence of one or more defects in at least one optical element in the light source;
   (d) storing the results of the filtering operation in a database, wherein steps (a) through (c) are performed repeatedly over a period of time to detect the state repeatedly;
   (e) determining an evolution of the state over time from the plurality of stored results of the filtering step; and
   (f) adjusting the light source after a period of time having a duration based at least in part on the evolution of the state over time.

5. A method as claimed in claim 4 wherein one of the one or more defects in the image is a slip plane defect.

6. A method for automatically detecting a state of a light source for semiconductor photolithography, the method comprising the steps of:
   (a) obtaining at least a portion of an image of a light beam produced by the light source;
   (b) obtaining image data from the portion;
   (c) filtering the image data using template matching to detect a state of the light source;
   (d) storing the results of the filtering operation in a database, wherein steps (a) through (c) are performed repeatedly over a period of time to detect the state repeatedly, wherein the storing the results of the filtering operation in a database includes appending the results of the filtering operation to a database containing a plurality of previous results of performing steps (a) through (c);
   (e) determining an evolution of the state over time from the plurality of stored results of the filtering step; and
   (f) adjusting the light source after a period of time having a duration based at least in part on the evolution of the state over time.

7. A method as claimed in claim 6 wherein the results are appended using wrap-around indexing.

8. A method as claimed in claim 6 wherein the results are appended using bit shifting.

9. A method for automatically detecting a state of a light source for semiconductor photolithography, the method comprising the steps of:
   (a) obtaining at least a portion of an image of a light beam produced by the light source;
   (b) obtaining image data from the portion;
   (c) filtering the image data using template matching to detect a state of the light source;
   (d) storing the results of the filtering operation in a database, wherein steps (a) through (c) are performed repeatedly over a period of time to detect the state repeatedly;
   (e) generating a video image from the results stored in the database
   (f) determining an evolution of the state over time from the plurality of stored results of the filtering step; and
   (g) adjusting the light source after a period of time having a duration based at least in part on the evolution of the state over time.

10. A method for automatically detecting a state of a light source for semiconductor photolithography, the method comprising the steps of:
    generating an output laser beam;
    traversing an optical path including a plurality of optical components of the light source with the laser beam;
    using a first portion of the output laser beam to pattern features on a wafer;
    using a second portion of the output laser beam to generate an image on a screen element of the second portion using an optical module arranged to receive the second portion and convey the second portion to the screen element; and
    acquiring the image,
    wherein the optical module is arranged optically between the plurality of optical components and the screen element and comprises at least one movable optical element for altering the image on the screen element.

11. A method as claimed in claim 10 further comprising the steps of:
    using the second portion of the laser beam repeatedly over a period of time to generate a series of images on the screen element of the second portion using an optical module arranged to receive the second portion and convey the second portion to the screen element;
    filtering data from each the images using template matching to detect a state of the light source based on the data;
    storing results of the filtering step in a database;
    determining an evolution of the state over the period of time from the stored results; and
    adjusting the light source after an interval having a duration based at least in part on the evolution of the state over the period of time.

12. A method as claimed in claim 10 wherein the optical module comprises a variable focus lens.

13. A method as claimed in claim 10 wherein the optical module comprises a varifocal lens.

14. A method as claimed in claim 10 wherein the optical module comprises a parfocal lens.

15. A method as claimed in claim 10 wherein the step of acquiring an image comprises acquiring an image of a cross section of the laser beam immediately after the beam has traversed at least one optical element in the optical path.

16. A method as claimed in claim 10 further comprising a step of actuating a driver to move the movable optical element to alter the image on the screen element.

17. A method as claimed in claim 16 wherein the step of actuating a driver comprises actuating a stepper motor.

18. A method as claimed in claim 16 wherein the step of actuating a driver comprises actuating a piezoelectric translator.

19. A method as claimed in claim 16 wherein the optical path includes a first optical element and a second optical element and wherein the optical module is arranged optically after the first and second optical elements and before the screen element, and wherein the step of actuating a driver comprises moving the at least one movable optical element between a first position in which the image is of a cross section of the beam immediately after the beam has traversed the first optical element and a second position in which the image is of a cross section of the beam after the beam has traversed both the first optical element and the second optical element.

20. A method as claimed in claim 16 wherein the step of actuating a driver comprises moving a fixed focus lens into the optical path.

\* \* \* \* \*